(12) United States Patent
Dolny et al.

(10) Patent No.: US 9,947,787 B2
(45) Date of Patent: Apr. 17, 2018

(54) DEVICES AND METHODS FOR A POWER TRANSISTOR HAVING A SCHOTTKY OR SCHOTTKY-LIKE CONTACT

(71) Applicant: Silicet, LLC, Chapel Hill, NC (US)

(72) Inventors: Gary M. Dolny, Chapel Hill, NC (US); William R. Richards, Jr., Chapel Hill, NC (US); Randall Milanowski, Chapel Hill, NC (US)

(73) Assignee: SILICET, LLC, Chapel Hill, NC (US)

( * ) Notice: Subject to any disclaimer, the term of this patent is extended or adjusted under 35 U.S.C. 154(b) by 0 days.

(21) Appl. No.: 15/581,768

(22) Filed: Apr. 28, 2017

(65) Prior Publication Data

US 2017/0323970 A1    Nov. 9, 2017

Related U.S. Application Data

(60) Provisional application No. 62/333,073, filed on May 6, 2016.

(51) Int. Cl.
*H01L 29/78* (2006.01)
*H01L 29/66* (2006.01)

(52) U.S. Cl.
CPC ........ *H01L 29/7839* (2013.01); *H01L 29/665* (2013.01); *H01L 29/66681* (2013.01); *H01L 29/7813* (2013.01); *H01L 29/7816* (2013.01)

(58) Field of Classification Search
CPC ............... H01L 29/7839; H01L 29/665; H01L 29/66681; H01L 29/7813; H01L 29/7816
See application file for complete search history.

(56) References Cited

U.S. PATENT DOCUMENTS

| | | | |
|---|---|---|---|
| 4,362,597 A | 12/1982 | Fraser et al. | |
| 4,692,348 A | 9/1987 | Rubloff et al. | |
| 4,983,535 A | 1/1991 | Blanchard | |
| 5,585,294 A * | 12/1996 | Smayling | H01L 27/088 257/E21.417 |
| 5,663,584 A | 9/1997 | Welch | |

(Continued)

OTHER PUBLICATIONS

Jain, A. & Parthavi, U.; "Schottky Laterally Double Diffused Metal Oxide Semiconductor", Department of Electrical Engineering, Indian Institute of Technology, Delhi, Hauz Khas, New Delhi—110016, India, May 2010, Entire Document.

(Continued)

*Primary Examiner* — Matthew Reames
(74) *Attorney, Agent, or Firm* — NEO IP

(57) ABSTRACT

Devices, structures, and methods thereof for providing a Schottky or Schottky-like contact as a source region and/or a drain region of a power transistor are disclosed. A power transistor structure comprises a substrate of a first dopant polarity, a drift region formed on or within the substrate, a body region formed on or within the drift region, a gate structure formed on or within the substrate, a source region adjacent to the gate structure, a drain region formed adjacent to the gate structure. At least one of the source region and the drain region is formed from a Schottky or Schottky-like contact substantially near a surface of the substrate, comprising a silicide layer and an interfacial dopant segregation layer. The Schottky or Schottky-like contact is formed by low-temperature annealing a dopant segregation implant in the source and/or drain region.

5 Claims, 17 Drawing Sheets

(56) References Cited

U.S. PATENT DOCUMENTS

| | | | |
|---|---|---|---|
| 5,808,340 | A | 9/1998 | Wollesen et al. |
| 5,960,271 | A | 9/1999 | Wollesen et al. |
| 6,252,278 | B1* | 6/2001 | Hsing ............... H01L 29/7816 257/335 |
| 6,744,103 | B2 | 6/2004 | Snyder |
| 6,777,745 | B2 | 8/2004 | Hshieh et al. |
| 6,876,035 | B2 | 4/2005 | Abadeer et al. |
| 6,900,101 | B2 | 5/2005 | Lin |
| 7,081,655 | B2 | 7/2006 | Maszara |
| 7,306,998 | B2 | 12/2007 | Maszara |
| 7,576,388 | B1 | 8/2009 | Wilson et al. |
| 7,745,846 | B2 | 6/2010 | Korec et al. |
| 7,851,889 | B2* | 12/2010 | Zhu ............... H01L 29/0692 257/401 |
| 7,960,997 | B2 | 6/2011 | Williams |
| 8,058,167 | B2 | 11/2011 | Snyder et al. |
| 8,508,015 | B2 | 8/2013 | Allen et al. |
| 8,889,537 | B2 | 11/2014 | Cabral et al. |
| 9,337,329 | B2 | 5/2016 | Hu et al. |
| 9,425,304 | B2 | 8/2016 | Zhang et al. |
| 2010/0059819 | A1 | 3/2010 | Snyder |
| 2015/0187928 | A1* | 7/2015 | Wang ............... H01L 27/0727 257/337 |

OTHER PUBLICATIONS

A. Kinoshita, C. Tanaka, K. Uchida and J. Koga, "High-performance 50-nm-Gate-Length Schottky-Source/Drain MOSFETs with Dopant-Segregation Junctions", Symposium on VLSI Technology Digest of Technical Papers, 2005, pp. 158-159.

A. Kinoshita, Y. Tsuchiya, A. Yagishita, K. Uchida and J. Koga, "Solution for High-Performance Schottky-Source/Drain MOSFETs: Schottky Barrier Height Engineering with Dopant Segregation Technique", Symposium on VLSI Technology Digest of Technical Papers, pp. 168-169, 2004.

Atsuhiro Kinoshita, "Dopant Segregated Schottky S/D and Application to High Performance MOSFETs", Ext. Abs. the 9th International Workshop on Junction Technology, 2009, pp. 34-37.

Atsuhiro Kinoshita, "Dopant-Segregated Source/Drain Technology for High-Performance CMOS", IEDM 2008.

T. Kinoshita, R. Hasumi, M. Hamaguchi, K. Miyashita, T. Komoda, A. Kinoshita, J. Koga, K. Adachi, Y. Toyoshima, T. Nakayama, S. Yamada and F. Matsuoka, "Ultra-Low Voltage Operations in Bulk CMOS Logic Circuits with Dopant Segregated Schottky Source/Drain Transistors", IEDM 2006.

Yoshifumi Nishi, Takashi Yamauchi, Takao Marukame, Atsuhiro Kinoshita, Junji Koga, and Koichi Kato, "Schottky Barrier Height Modulation by Atomic Dipoles at the Silicide/Silicon Interface", Physical Review B 84, 115323-1-5 (2011).

* cited by examiner

DEVICES AND METHODS FOR A POWER TRANSISTOR HAVING A SCHOTTKY OR SCHOTTKY-LIKE CONTACT

CROSS-REFERENCES TO RELATED APPLICATIONS

The present invention is related to and claims priority from the following U.S. patent documents: this application claims priority from U.S. Provisional Patent Application No. 62/333,073, filed May 6, 2016, which is incorporated herein by reference in its entirety.

BACKGROUND

1. Field of the Invention

The present invention relates generally to power transistor structure and devices, more particularly, to a power transistor and device having a Schottky or Schottky-like contact.

2. Description of the Prior Art

Voltage regulation is important where circuits are sensitive to transients, noise and other types of disturbances. The device temperature is key to many applications. Additionally, power consumption is also a key design requirement.

Power transistors are used for many applications, such as direct current (DC) to direct current (DC) conversion, voltage regulation, and battery management, in fields such as mobile electronics, consumer electronics, and automotive electronics. These applications are often subject to harsh electrical environments that lead to operating conditions which require the device to withstand high voltages and high currents simultaneously.

The area within the boundary of the operating conditions that avoids electrical overstress (e.g. over-current, over-voltage and over-power) is referred to as the safe operating area (SOA). In the conventional art, large excursions of voltage and current can lead to activation of a parasitic bipolar transistor inherent in many power transistors, leading to destructive failure.

To avoid electrical overstress and potential device failures, the maximum rated operating voltage for a device includes a safety margin substantially less than the physical breakdown voltage of the device. However, this approach increases the on-state resistance of the device which limits the efficiency of the device and wastes electrical power.

Alternative approaches to alleviate the Safe Operating Area (SOA) limitation is achieved by introducing deep p+ regions into the p-body in the device and/or using recessed contact structures. These alternative approaches lead to increased complexity, increased die area, and increased cost.

By way of example the following are relevant prior art documents:

U.S. Pat. No. 6,744,103 B2 for "Short-channel Schottky-barrier MOSFET device and manufacturing method" by inventor John P. Snyder, filed Sep. 6, 2002, describes a MOSFET device and method of fabricating. The MOSFET device utilizes Schottky barrier contacts for source and/or drain contact fabrication within the context of a MOSFET device structure to eliminate the requirement for halo/pocket implants and shallow source/drain extensions to control short channel effects. Additionally, the present invention unconditionally eliminates the parasitic bipolar gain associated with MOSFET fabrication, reduces manufacturing costs, tightens control of device performance parameters, and provides for superior device characteristics as compared to the prior art.

U.S. Publication No. 2010/0059819 for "Power transistor with metal source and method of manufacture" by inventor John P. Snyder, filed Aug. 20, 2009, describes a metal source power transistor device and method of manufacture. The metal source power transistor having a source which is comprised of metal and which forms a Schottky barrier with the body region and channel region of the transistor. The metal source power transistor is unconditionally immune from parasitic bipolar action and, therefore, the effects of snap-back and latch-up, without the need for a body contact. The ability to allow the body to float in the metal source power transistor reduces the process complexity and allows for more compact device layout.

U.S. Pat. No. 8,058,167 B2 for "Dynamic Schottky barrier MOSFET device and method of manufacture" by inventor John P. Synder, filed Sep. 28, 2009, describes a device for regulating a flow of electric current and its manufacturing method. The device includes metal-insulator-semiconductor source-drain contacts forming Schottky barrier or Schottky-like junctions to the semiconductor substrate. The device includes an interfacial layer between the semiconductor substrate and a metal source and/or drain electrode, thereby dynamically adjusting a Schottky barrier height by applying different bias conditions. The dynamic Schottky barrier modulation provides increased electric current for low drain bias conditions, reducing the sub-linear turn-on characteristic of Schottky barrier MOSFET devices and improving device performance.

U.S. Pat. No. 4,983,535A for "Vertical DMOS transistor fabrication process" by inventor Richard A. Blanchard, filed Dec. 28, 1988, describes a process for fabricating a vertical DMOS transistor. The starting material is a heavily doped silicon wafer which has an epitaxial layer thereon. A DMOS body region is diffused into the epitaxial layer and a deep body contact region created. The source is a refractory metal Schottky barrier located on top of the body region. A trench is etched into the epitaxial layer so as to fully penetrate the body region and the trench surfaces oxidized to form a gate oxide. The trench is then filled with doped polysilicon to create a gate electrode. The resulting DMOS has a relatively short channel and the parallel bipolar parasitic transistor cannot be turned on.

U.S. Pat. No. 6,777,745 B2 for "Symmetric trench MOSFET device and method of making same" by inventor Fwu-Iuan Hshieh et al., filed Jun. 14, 2001, descries A trench MOSFET transistor device and method of making the same are provided. The trench MOSFET transistor device comprises: (a) a drain region of first conductivity type; (b) a body region of a second conductivity type provided over the drain region, such that the drain region and the body region form a first junction; (c) a source region of the first conductivity type provided over the body region, such that the source region and the body region form a second junction; (d) source metal disposed on an upper surface of the source region; (e) a trench extending through the source region, through the body region and into the drain region; and (f) a gate region comprising (i) an insulating layer, which lines at least a portion of the trench and (ii) a conductive region, which is disposed within the trench adjacent the insulating layer. The body region in this device is separated from the source metal. Moreover, the doping profile within the body region and within at least a portion of the source and drain regions, when taken along a line normal to upper and lower surfaces of the device, is such that the doping profile on one side of a centerplane of the body region is symmetric with the doping profile on an opposite side of the centerplane.

U.S. Pat. No. 9,337,329 B2 for "Method of fabrication and device configuration of asymmetrical DMOSFET with schottky barrier source" by inventor Yongzhong Hu et al., filed Sep. 8, 2011, describes a trenched semiconductor power device including a trenched gate insulated by a gate insulation layer and surrounded by a source region encompassed in a body region above a drain region disposed on a bottom surface of a semiconductor substrate. The source region surrounding the trenched gate includes a metal of low barrier height to function as a Schottky source and that may include a PtSi, ErSi layer and may further be a metal silicide layer having the low barrier height. A top oxide layer is disposed under a silicon nitride spacer on top of the trenched gate for insulating the trenched gate from the source region. A source contact disposed in a trench opened into the body region for contacting a body-contact dopant region and covering with a conductive metal layer such as a Ti/TiN layer.

U.S. Pat. No. 6,900,101 B2 for "LDMOS transistors and methods for making the same" by inventor John Lin, filed Jun. 13, 2003, describes LDMOS transistor devices and fabrication methods. Additional dopants are provided to region of a substrate near a thick dielectric between the channel and the drain to reduce device resistance without significantly impacting breakdown voltage. The extra dopants are added by implantation prior to formation of the thick dielectric, such as before oxidizing silicon in a LOCOS process or following trench formation and before filling the trench in an STI process.

U.S. Pat. No. 6,876,035 B2 for "High voltage N-LDMOS transistors having shallow trench isolation region" by inventors Wagdi W. Abadeer et al., filed May 6, 2003, describes a method and structure for a transistor having a gate, a channel region below the gate, a source region on one side of the channel region, a drain region on an opposite side of the channel region from the source region, a shallow trench isolation (STI) region in the substrate between the drain region and the channel region, and a drain extension below the STI region. The drain extension is positioned along a bottom of the STI region and along a portion of sides of the STI. Portions of the drain extension along the bottom of the STI may comprise different dopant implants than the portions of the drain extensions along the sides of the STI. Portions of the drain extensions along sides of the STI extend from the bottom of the STI to a position partially up the sides of the STI. The STI region is below a portion of the gate. The drain extension provides a conductive path between the drain region and the channel region around a lower perimeter of the STI. The drain region is positioned further from the gate than the source region.

U.S. Pat. No. 7,576,388 B1 for "Trench-gate LDMOS structures" by inventors Peter H. Wilson et al., filed Sep. 26, 2004, describes MOSFET devices for RF applications that use a trench-gate in place of the lateral gate conventionally used in lateral MOSFET devices. A trench-gate provides devices with a single, short channel for high frequency gain. Embodiments of the present invention provide devices with an asymmetric oxide in the trench gate, as well as LDD regions that lower the gate-drain capacitance for improved RF performance. Refinements to these TG-LDMOS devices include placing a source-shield conductor below the gate and placing two gates in a trench-gate region. These improve device high-frequency performance by decreasing gate-to-drain capacitance. Further refinements include adding a charge balance region to the LDD region and adding source-to-substrate or drain-to-substrate vias. U.S. Pat. No. 7,576,388 describes a structure and method for a trench-gate LDMOS structure as shown in the prior art figures.

U.S. Pat. No. 5,960,271 A for "Short channel self-aligned VMOS field effect transistor" by inventors Donald L. Wollesen et al., filed Mar. 17, 1998, describes a field effect transistor with a trench or groove gate having V-shaped walls is formed in a semiconductor substrate and a gate oxide is grown on the V-shaped walls to the surface of substrate and filled with a gate electrode material, such a polysilicon. Preferably, the bottom of the V-shaped walls is rounded before the trench is filled. Source/drain impurities either are diffused or implanted into the areas of the substrate on both sides of the surface oxide of the V-shaped gate. Contacts are made to the source, drain, and gate within field isolation to complete the structure. The resultant FET structure comprises a self-aligned V-shaped gate having conventional source and drain surrounded by field isolation but with an effective channel length ($L_{eff}$) of less than about one-half of the surface width of the gate. Preferably, the converging walls of the V-shaped gate end in a rounded concave bottom. Because of the V-shaped structure of the gate, the effective saturated length of the channel with drain voltage applied only extends from the edge of the source to just prior to the tip of the V-shaped structure in the interior of the semiconductor substrate. The drain side of the V-shaped structure becomes a depletion region due to the applied drain voltage. Due to this characteristic of such a structure, the surface width of the gate can be, for example, two or more times the distance of the desired channel length thereby permitting conventional lithography to be used to define the gate lengths much shorter than the lithographic limit.

U.S. Pat. No. 5,808,340 A for "Short channel self aligned VMOS field effect transistor" by inventors Donald L. Wollesen et al., filed Sep. 18, 1996, describes A field effect transistor with a trench or groove gate having V-shaped walls is formed in a semiconductor substrate and a gate oxide is grown on the V-shaped walls to the surface of substrate and filled with a gate electrode material, such a polysilicon. Preferably, the bottom of the V-shaped walls is rounded before the trench is filled. Source/drain impurities either are diffused or implanted into the areas of the substrate on both sides of the surface oxide of the V-shaped gate. Contacts are made to the source, drain, and gate within field isolation to complete the structure. The resultant FET structure comprises a self-aligned V-shaped gate having conventional source and drain surrounded by field isolation but with an effective channel length ($L_{eff}$) of less than about one-half of the surface width of the gate. Preferably, the converging walls of the V-shaped gate end in a rounded concave bottom. Because of the V-shaped structure of the gate, the effective saturated length of the channel with drain voltage applied only extends from the edge of the source to just prior to the tip of the V-shaped structure in the interior of the semiconductor substrate. The drain side of the V-shaped structure becomes a depletion region due to the applied drain voltage. Due to this characteristic of such a structure, the surface width of the gate can be, for example, two or more times the distance of the desired channel length thereby permitting conventional lithography to be used to define the gate lengths much shorter than the lithographic limit.

U.S. Pat. No. 7,745,846 B2 for "LDMOS integrated Schottky diode" by inventors Jacek Korec et al., filed Jan. 15, 2008, describes a semiconductor device including a substrate having a first conductivity type and a semiconductor layer formed over the substrate and having lower and upper surfaces. A laterally diffused metal-oxide-semiconductor (LDMOS) transistor device is formed over the substrate and includes a source region of the first conductivity type and a drain extension region of the first conductivity type formed in the semiconductor layer proximate the upper surface of the semiconductor layer, and a drain contact electrically connecting the drain extension region to the substrate. A Schottky diode is formed over the substrate and includes at least one doped region of the first conductivity type formed in the semiconductor layer proximate to the upper surface, an anode contact forming a Schottky barrier with the at least one doped region, and a cathode contact laterally spaced from the anode contact and electrically connecting at least one doped region to the substrate.

U.S. Pat. No. 7,960,997 B2 for "Cascode current sensor for discrete power semiconductor devices" by inventor Richard K. Williams, filed Aug. 8, 2007, describes A cascode current sensor includes a main MOSFET and a sense MOSFET. The drain terminal of the main MOSFET is connected to a power device whose current is to be monitored, and the source and gate terminals of the main MOSFET are connected to the source and gate terminals, respectively, of the sense MOSFET. The drain voltages of the main and sense MOSFETs are equalized, in one embodiment by using a variable current source and negative feedback. The gate width of the main MOSFET is typically larger than the gate width of the sense MOSFET. Using the size ratio of the gate widths, the current in the main MOSFET is measured by sensing the magnitude of the current in the sense MOSFET. Inserting the relatively large MOSFET in the power circuit minimizes power loss.

U.S. Pat. No. 5,663,584 A for "Schottky barrier MOSFET systems and fabrication thereof" by inventor James D. Welch, filed Dec. 29, 1994, describes (MOS) device systems-utilizing Schottky barrier source and drain to channel region junctions are disclosed. Experimentally derived results which demonstrate operation of fabricated N-channel and P-channel Schottky barrier (MOSFET) devices, and of fabricated single devices with operational characteristics similar to (CMOS) and to a non-latching (SRC) are reported. Use of essentially non-rectifying Schottky barriers in (MOS) structures involving highly doped and the like and intrinsic semiconductor to allow non-rectifying interconnection of, and electrical accessing of device regions is also disclosed. Insulator effected low leakage current device geometries and fabrication procedures therefore are taught. Selective electrical interconnection of drain to drain, source to drain, or source to source, of N-channel and/or P-channel Schottky barrier (MOSFET) devices formed on P-type, N-type and Intrinsic semiconductor allows realization of Schottky Barrier (CMOS), (MOSFET) with (MOSFET) load, balanced differential (MOSFET) device systems and inverting and non-inverting single devices with operating characteristics similar to (CMOS), which devices can be utilized in modulation, as well as in voltage controlled switching and effecting a direction of rectification.

U.S. Pat. No. 8,508,015 B2 for "Schottky-like contact and method of fabrication" by inventors Martin Ward Allen et al., filed May 19, 2008, describes Schottky-like and ohmic contacts comprising metal oxides on zinc oxide substrates and a method of forming such contacts. The metal oxide Schottky-like and ohmic contacts may be formed on zinc oxide substrates using various deposition and lift-off photolithographic techniques. The barrier heights of the metal oxide Schottky-like contacts are significantly higher than those for plain metals and their ideality factors are very close to the image force controlled limit. The contacts may have application in diodes, power electronics, FET transistors and related structures, and in various optoelectronic devices, such as UV photodetectors.

U.S. Pat. No. 7,081,655 B2 for "Formation of abrupt junctions in devices by using silicide growth dopant snowplow effect" by inventor Witold P. Maszara, filed Dec. 3, 2003, describes a method of forming an abrupt junction device with a semiconductor substrate. A gate dielectric is formed on a semiconductor substrate, and a gate is formed on the gate dielectric. A sidewall spacer is formed on the semiconductor substrate adjacent the gate and the gate dielectric. A thickening layer is formed by selective epitaxial growth on the semiconductor substrate adjacent the sidewall spacer. Raised source/drain dopant implanted regions are formed in at least a portion of the thickening layer. Silicide layers are formed in at least a portion of the raised source/drain dopant implanted regions to form source/drain regions, beneath the silicide layers, that are enriched with dopant from the silicide layers. A dielectric layer is deposited over the silicide layers, and contacts are then formed in the dielectric layer to the silicide layers.

U.S. Pat. No. 7,306,998 B2 for "Formation of abrupt junctions in devices by using silicide growth dopant snowplow effect" by inventor Witold P. Maszara, filed Jun. 7, 2005, describes a method of forming an abrupt junction device with a semiconductor substrate. A gate dielectric is formed on a semiconductor substrate, and a gate is formed on the gate dielectric. A sidewall spacer is formed on the semiconductor substrate adjacent the gate and the gate dielectric. A thickening layer is formed by selective epitaxial growth on the semiconductor substrate adjacent the sidewall spacer. Raised source/drain dopant implanted regions are formed in at least a portion of the thickening layer. Silicide layers are formed in at least a portion of the raised source/drain dopant implanted regions to form source/drain regions, beneath the silicide layers, that are enriched with dopant from the silicide layers. A dielectric layer is deposited over the silicide layers, and contacts are then formed in the dielectric layer to the silicide layers.

U.S. Pat. No. 8,889,537 B2 for "Implantless dopant segregation for silicide contacts" by inventors Cryil Cabral Jr. et al., filed Jul. 9, 2010, describes a method for formation of a segregated interfacial dopant layer at a junction between a semiconductor material and a silicide layer. the method includes depositing a doped metal layer over the semiconductor material; annealing the doped metal layer and the semiconductor material, wherein the anneal causes a portion of the doped metal layer and a portion of the semiconductor material to react to form the silicide layer on the semiconductor material, and wherein the anneal further causes the segregated interfacial dopant layer to form between the semiconductor material and the silicide layer, the segregated interfacial dopant layer comprising dopants from the doped metal layer; and removing an unreacted portion of the doped metal layer from the silicide layer.

U.S. Pat. No. 4,692,348 A for "Low temperature shallow doping technique" by inventors Gary W. Rubloff et al., filed Jul. 28, 1986, describes a technique for producing very shallow doped regions in a substrate, at low temperatures. The doped regions are not in excess of about 300 angstroms in depth, and are formed at temperatures less than 700° C. These shallow doped regions can be used in different applications, including the fabrication of semiconductor switching devices, diodes, and contacts. Overlayers containing the desired dopants are deposited on the substrate, after which an annealing step is carried out to institute the formation of a metallic compound. When the compound is formed, materials in the overlayers to be used as substrate dopants will be pushed ahead of the interface of the growing compound, and will be snowplowed into the top surface of the substrate, to produce the shallow doped region therein.

U.S. Pat. No. 4,362,597 for "Method of fabricating high-conductivity silicide-on-polysilicon structures for MOS devices" by inventors Devid B. Fraser et al, filed Jan. 19, 1981, describes a method for fabricating high-conductivity silicide-on-polysilicon for MOS devices. It is known to deposit a refractory metal silicide on a polysilicon gate layer to form a low-resistivity composite structure. For VLSI MOS devices, very-high-resolution patterning of the composite structure is required. In accordance with this invention, a silicide pattern is formed on polysilicon by a lift-off technique. In turn, the patterned silicide is utilized as a mask for anisotropic etching of the underlying polysilicon. High-conductivity composite silicide-on-polysilicon gate structures for VLSI MOS devices are thereby achieved.

None of the prior art documents describes power transistor structures and methods for having a Schottky or Schottky-like contact as the source and/or drain region as provided in the present invention.

SUMMARY OF THE INVENTION

The present invention provides power transistor structures and methods of making thereof for having a Schottky or Schottky-like contact as the source region and/or the drain region for improved safe operating area (SOA), improved unclamped inductive switching, improved device reliability, reduced device size, and low on-resistance.

In one embodiment, a power transistor structure comprises a substrate of a first dopant polarity, a drift region of a second dopant polarity formed on or within the substrate, a body region of a first dopant polarity formed within the drift region, a gate dielectric film, a gate structure abutting the gate dielectric, a drain region adjacent to the gate structure, a source region adjacent to the gate structure, and at least one of the source region and the drain region is a Schottky or Schottky-like contact, wherein the Schottky or Schottky-like contact is formed substantially near the surface of the substrate comprising a silicide layer, an interfacial dopant segregation layer, wherein the interfacial dopant segregation layer is substantially near the gate structure to provide electrical coupling to the gate and channel region.

In another embodiment, a Schottky Barrier LDMOS (SBLDMOS) transistor comprises a substrate wafer of a first polarity, a LDMOS drift region of a second dopant polarity formed within or on the substrate, a LDMOS body region of a first dopant polarity formed within the drift region, an isolation structure formed substantially near the surface of the substrate, a LDMOS gate dielectric film, a LDMOS gate structure abutting the gate dielectric, a LDMOS source region adjacent to the LDMOS gate structure, a LDMOS drain region formed in the substrate, and at least one of the LDMOS source region and the LDMOS drain region is a Schottky or Schottky-like contact formed substantially near the surface of the substrate.

In addition, a method of forming a Schottky Barrier LDMOS (SBLDMOS) structure is disclosed in the present invention, comprising: (1) providing a substrate wafer of a first polarity, (2) forming a drift region of a second polarity in the substrate wafer, (3) forming a body region of a first polarity in the drift region of a first polarity, (4) forming an isolation region from the substrate wafer surface, (5) forming a gate dielectric on the substrate wafer, (6) depositing a gate stack, (7) patterning the gate stack, (8) forming and patterning a spacer structure on the gate stack, (9) patterning and implanting a body contact of a first polarity, (10) patterning a LDMOS source, (11) implanting a dopant segregation implant for drain region of a second polarity, (12) low temperature anneal the dopant segregation implant to provide a Schottky or Schottky-like contact, and (13) patterning and defining interlevel dielectric (ILD) and interconnect wiring.

These and other aspects of the present invention will become apparent to those skilled in the art after a reading of the following description when considered with the drawings, as they support the claimed invention.

BRIEF DESCRIPTION OF THE DRAWINGS

PRIOR ART

PRIOR ART

PRIOR ART

PRIOR ART

PRIOR ART

PRIOR ART

DETAILED DESCRIPTION

Figure 1:
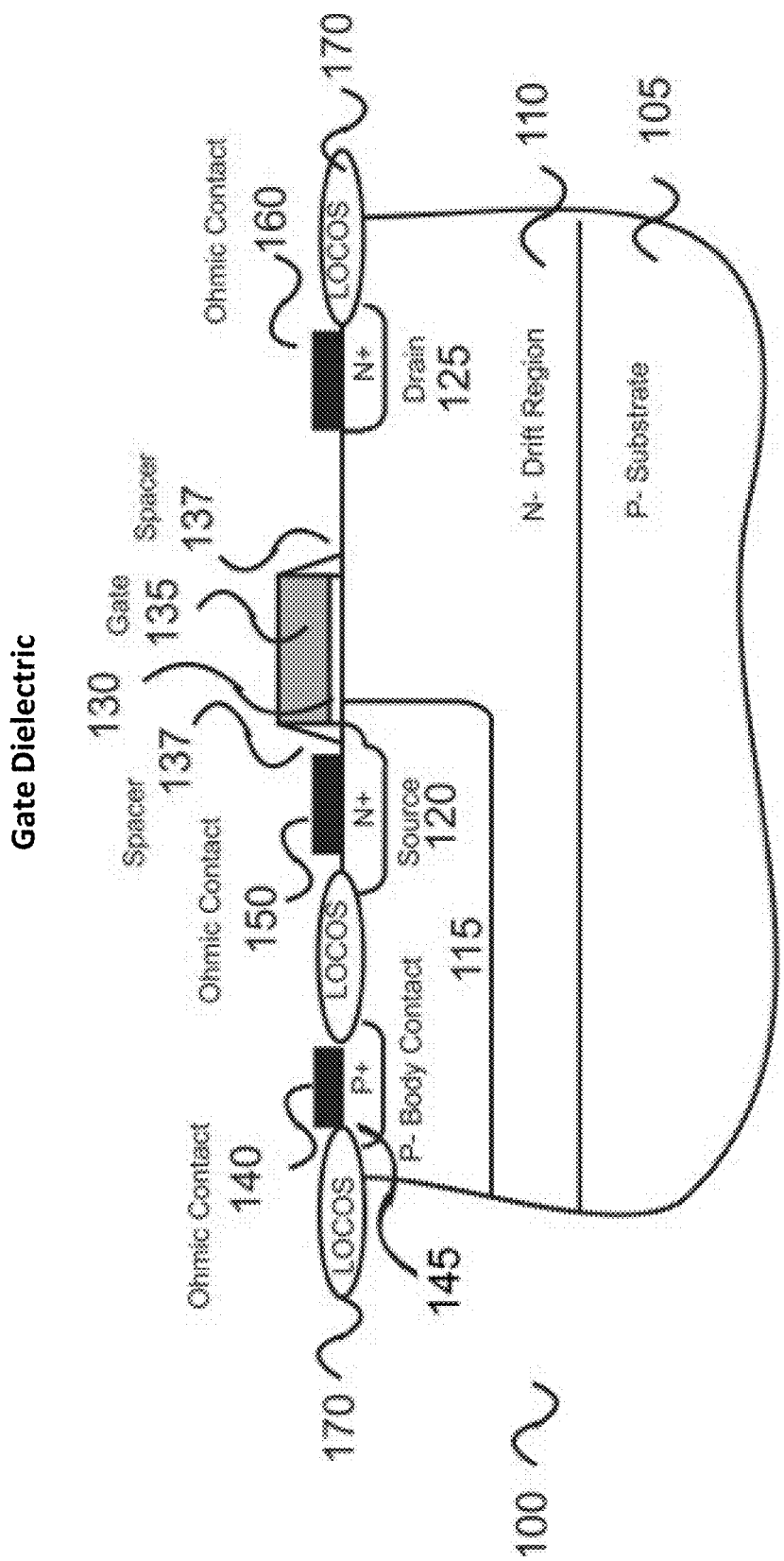
FIG. 1 illustrates a cross-section of a power MOSFET structure of prior art.

It is desirable to provide a device with low on-resistance and reduced die size, or both. It is desirable to provide a device with reduced process complexity. A principal object of the present invention is to provide a device and circuit with improved safe operating area (SOA). Another further object of the present invention is to provide a device and circuit with improved device reliability. Another further object of the present invention is to provide a device and circuit with reduced bipolar current gain of its parasitic bipolar junction transistor (BJT). Another further object of the present invention is to provide a device and circuit with immunity of failure under unclamped inductive switching events. Another further object of the present invention is to provide a device and circuit with reduced sensitivity to CMOS latchup. Another further object of the present invention is to provide a device and circuit with reduced sensitivity to single event latchup (SEL). In summary, the present invention provides power transistor devices with improved SOA with improved reliability without any negative side effect, for example, increased on-state resistance, increased device size or large additional manufacturing cost.

As used herein, a Schottky contact or Schottky-like contact is intended to mean a conducting layer (e.g., metal, silicide, and other conducting materials) formed on a semiconductor substrate to define a "rectifying barrier junction" between the conducting layer and the semiconductor substrate.

In one embodiment of the present invention, a Schottky Barrier lateral diffused power MOSFET (SBLDMOS) is provided by forming a Schottky contact or Schottky-like contact as a source region and/or a drain region. The Schottky contact or Schottky-like contact eliminates the parasitic n-p-n bipolar transistor, thereby eliminating the safe operating area limitation and all of its associated trade-offs or negative side effects. The p+ body in the prior art can also be eliminated in order to reduce the overall device size and thus improve specific on-state resistance. Another benefit that results from eliminating parasitic bipolar action in an LDMOS structure is immunity to catastrophic energetic ion-induced single event effects, including Single Event Burnout (SEB). SEB is a catastrophic failure mechanism in spacecraft power systems in which parasitic bipolar action, and subsequent device failure, is triggered by the charge track produced when cosmic ions and/or protons pass through device active volumes. Since the SBLDMOS structure eliminates the parasitic bipolar, it enables radiation hardened spacecraft power management solutions using the present invention.

In another embodiment of the present invention, a source region and/or a drain region of a trench type vertical power MOSFET transistor are formed using a Schottky or Schottky-like contact. The Schottky or Schottky-like contact eliminates the parasitic n-p-n bipolar transistor, thereby decreasing the likelihood of catastrophic failure due to unclamped inductive switching events commonly encountered by this type of device.

The present invention and the corresponding advantages and features provided thereby will be best understood and appreciated upon review of the following detailed description, taken in conjunction with the following drawings, where like numerals represent like elements.

Prior Art FIG. 1 illustrates a cross section of a power MOSFET structure of prior art. The structure 100 contains a substrate wafer 105. An n− region 110 forms a drift region, n− drift, for the power MOSFET 100. The n− drift region 110 can be formed in bulk silicon, as an n-type epitaxial layer on a p-type or n-type substrate, or a silicon-on-insulator (SOI) wafer, or as an implanted and diffused region into either a bulk or epitaxial silicon layer. A p-body 115 is contained within the n− drift region 110. An n+ source 120 is contained within the p-body region 115. An n+ drain region 125 is fabricated in an n− drift region 110. A thin gate oxide 130 is formed on top of the n− drift region 110 and is partially covered by a film stack 135 typically formed from n+ polysilicon. A spacer 137 to space the implant from the gate channel region. A gate structure includes the gate dielectric 130, the spacer 137, and the film stack 135. The channel region is formed by the difference in lateral diffusion between a p-type body region 115 (also known as a p-well) and an n+ source region 120. The source and body regions are self-aligned (or non-self-aligned) to a common photolithographic feature or can be defined by separate photolithographic features. A p+ body contact region 145 also exists in the prior art structure for the purpose of minimizing gain of the parasitic n-p-n bipolar transistor formed from the n+ source 120, p-body 115, and the n− drift region 110. Ohmic contact regions 140, 150 and 160 are formed on the p+ body, n+ source, and n+ drain, respectively, using standard metallization techniques. Metallization layers and interlevel dielectric (ILD) are placed on the wafer surface.

Figure 2:
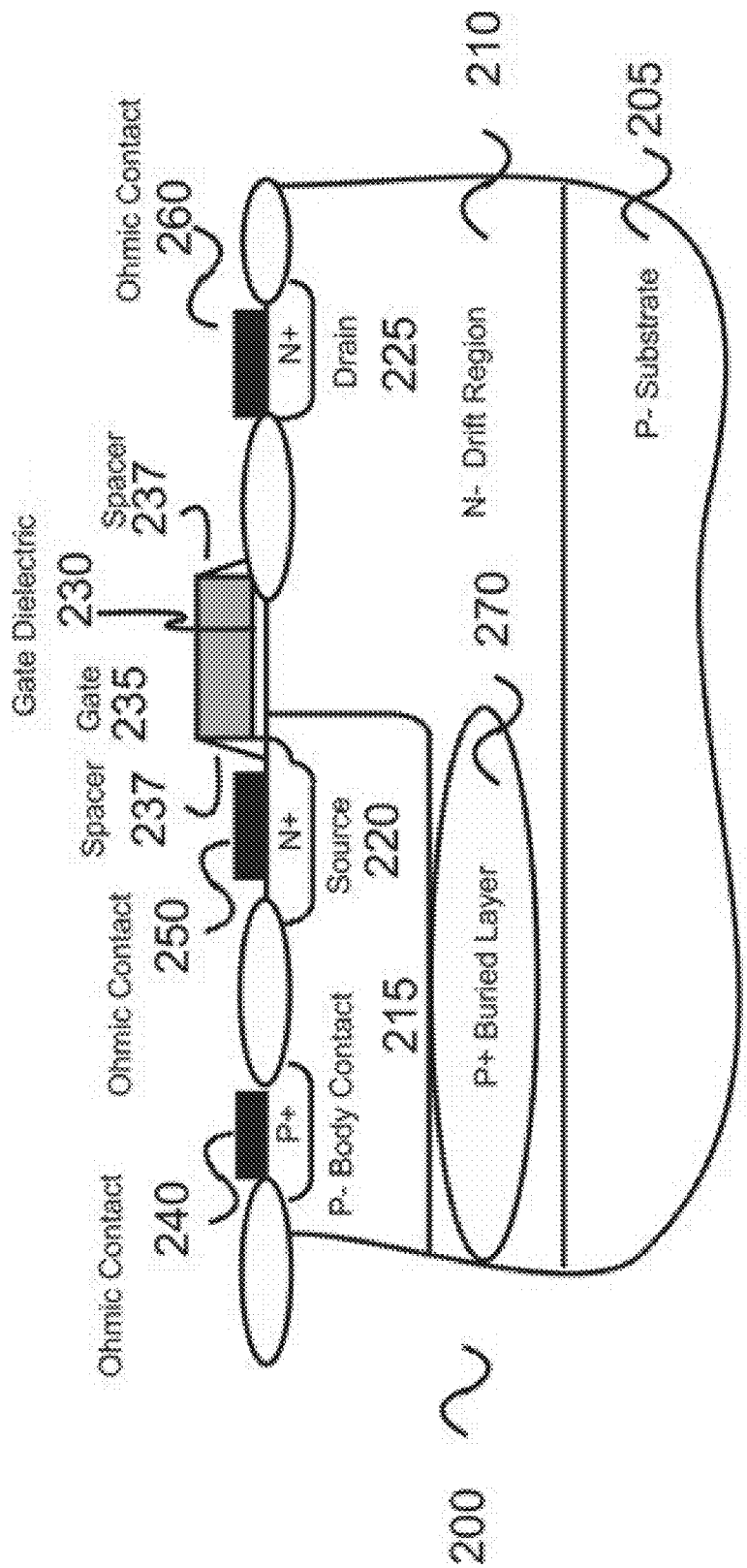
FIG. 2 illustrates a cross-section of a power MOSFET structure with a p+ buried body of prior art.

Prior Art FIG. 2 illustrates a cross section of a power MOSFET structure with a p+ buried body of prior art. The structure 200 contains a p-substrate wafer 205. An n− region 210 forms a drift region, n− drift, for the power MOSFET 200. The n− drift region 210 can be formed in bulk silicon, as an n-type epitaxial layer on a p-type or n-type substrate, or a silicon-on-insulator (SOI) wafer, or as an implanted and diffused region into either a bulk or epitaxial silicon layer. A p-body 215 is contained within the n− drift region 210. An n+ source 220 is contained within the p-body region 215. An n+ drain region 225 is fabricated in an n− drift region 210. An oxide 230 is formed on top of the n− drift region 210 and is partially covered by a gate structure 235 typically formed from n+ polysilicon. A spacer 237 is on the sides of the gate structure 235. The channel region is formed by the difference in lateral diffusion between a p-type body region 215 (also known as a p-well) and an n+ source region 220. The source and body regions are self-aligned (or non-self-aligned) to a common photolithographic feature or can be defined by separate photolithographic features. The power transistor 200 has a deep p+ buried body region 270 introduced beneath the n+ source region in physical contact. The purpose of the additional p+ buried body region 270 is to provide a low resistance path for removal of holes from the base region of the parasitic n-p-n transistor thus reducing its gain. It is understood that the introduction of the additional p+ buried body region increases device-manufacturing cost. A p+ body contact region 240 also exists in the prior art structure for the purpose of minimizing gain of the parasitic n-p-n bipolar transistor formed from the n+ source 220 (emitter), p-body 215 and the p+ body region 270 (base), an n− drift region 210 (collector). Ohmic contact regions 240, 250 and 260 are formed on the p+ body, n+ source, and n+ drain, respectively, using standard metallization techniques. Metallization layers and interlevel dielectric (ILD) are placed on the wafer surface (not shown).

Figure 3:
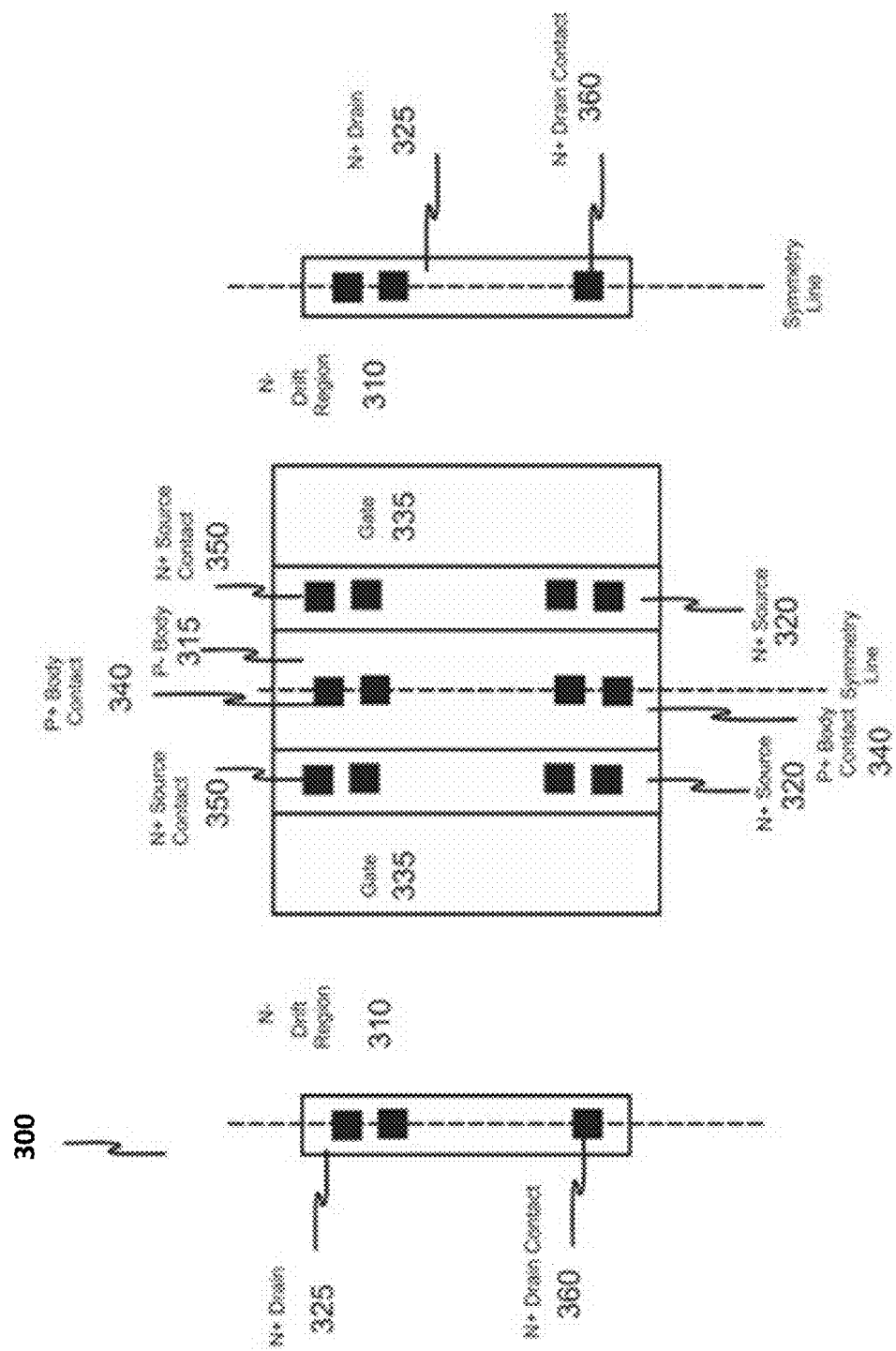
FIG. 3 illustrates a top surface view of a power MOSFET structure of prior art.

Prior Art FIG. 3 illustrates a top surface view of a power MOSFET structure 300 of prior art. The structure 300 contains a p-substrate wafer. An n-region 310 forms a drift region, n− drift, for the power MOSFET 300. The n− drift region 310 can be formed in bulk silicon, as an n-type epitaxial layer on a p-type or n-type substrate, or a silicon-on-insulator (SOI) wafer, or as an implanted and diffused region into either a bulk or epitaxial silicon layer. A p-body 315 is contained within the n− drift region 310. An n+ source 320 is contained within the p-body region 315. An n+ drain region 325 is fabricated in an n− drift region 310. An oxide is formed on top of the n− drift region 310 and is partially covered by a polysilicon gate structure 335 typically formed from n+ polysilicon. The channel region is formed by the difference in lateral diffusion between a p-type body region (also known as a p-well) and an n+ source region 320. The source and body regions are self-aligned (or non-self-aligned) to a common photolithographic feature or can be defined by separate photolithographic features. The power transistor 300 can have a deep p+ buried body region introduced beneath the n+ source region (as shown in FIG. 2). The purpose of the additional p+ buried body region is to provide a low resistance path for removal of holes from the base region of the parasitic n-p-n transistor thus reducing its gain. It is understood that the introduction of the additional p+ buried body region increases device-manufacturing cost. A p+ body contact region 340 also exists in the prior art structure for the purpose of minimizing gain of the parasitic n-p-n bipolar transistor formed from the n+ source 320 (emitter), p-body 315 (base), and the n− drift region 310 (collector). Ohmic contact regions 340, 350 and 360 are formed on the p+ body, n+ source, and n+ drain, respectively, using standard metallization techniques. Metallization layers and interlevel dielectric (ILD) are placed on the wafer surface (not shown). The structure requires a p+ body contact region 340. The purpose of the p+ body contact 340 is to provide a low resistance exit path for holes in the parasitic base region in an attempt to alleviate the undesired effects of the parasitic n-p-n transistor. It is understood that the p+ body contact 340 increases the area of the device.

Figure 4:
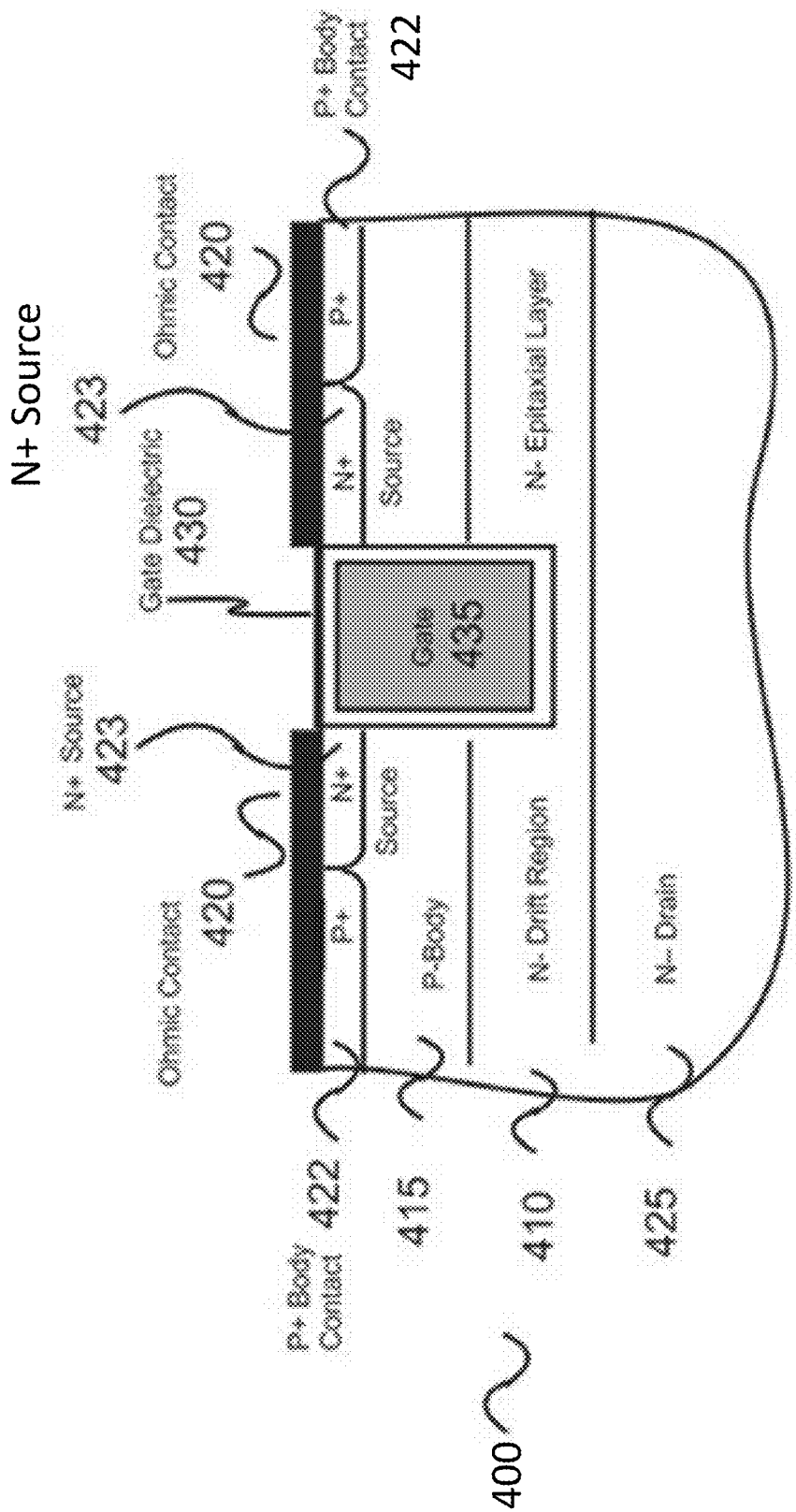
FIG. 4 illustrates a cross-section of a vertical trench power MOSFET structure of prior art.

Prior Art FIG. 4 illustrates a cross-section of an LDMOS with vertical trench gate of prior art. The structure 400 includes a p-body region 415 formed by the p-well, an n− drift region 410, n+ source 423 and p+ body contact 422 shorted together by a butted ohmic contact 420, an n-type drain region 425, a gate dielectric region 430 surrounding the gate electrode region 435. The drain structure 425 is an n-epitaxial layer on a n-type substrate. This structure 400 also contains a parasitic n-p-n transistor formed from the n+ source 423 (emitter), p-body 415 (base), to the combination of n− drift region 410 and n-type drain 425 (collector) with all the undesired characteristics described above.

Figure 5:
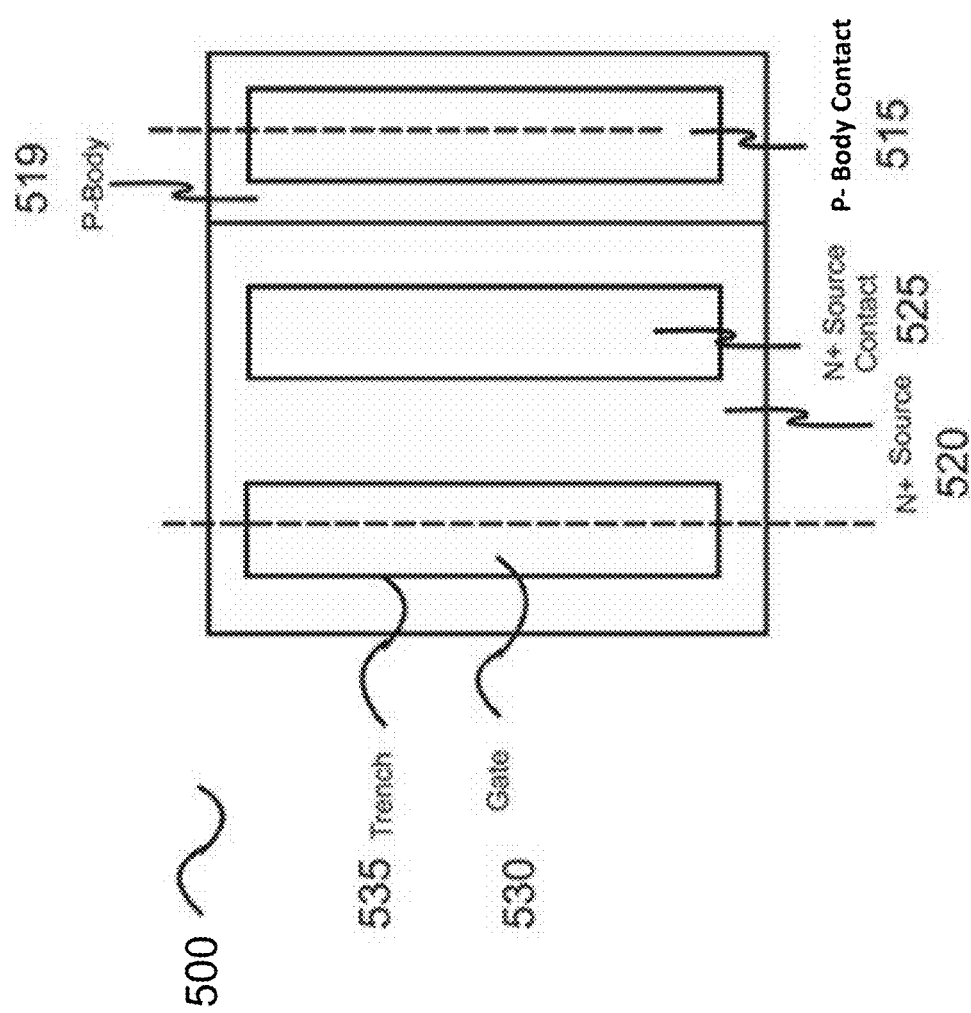
FIG. 5 illustrates a top surface view of a vertical trench power MOSFET structure of prior art.

Prior Art FIG. 5 illustrates a top surface view of a vertical trench power MOSFET 500 of prior art. The structure 500 contains a trench gate dielectric 530, and trench gate 535. The structure comprises a n+ source 520, n+ source contact 525, p-body 510, and p-body contact 515. The continuous p-body contact 515 increases the chip area of the power MOSFET device, which increases the total chip area.

Figure 6:
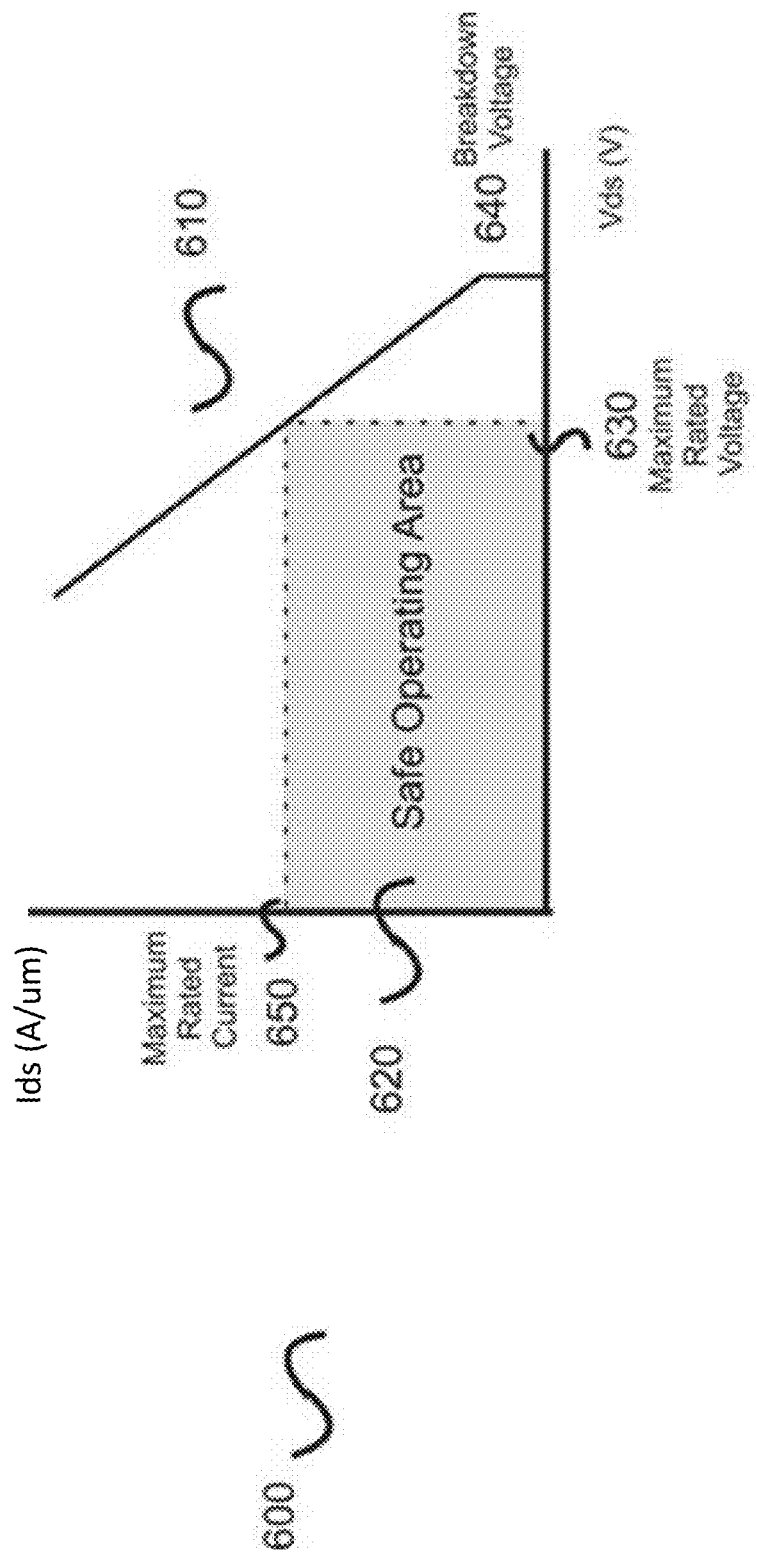
FIG. 6 illustrates a current-voltage (I-V) characteristic of a power MOSFET device of prior art.

Prior Art FIG. 6 illustrates a current-voltage (I-V) characteristic of a power MOSFET of prior art. FIG. 6 shows a plot 600 of the drain-to-source current (Ids) versus drain-to-source voltage (Vds). The snapback characteristic 610 is due to the activation of the parasitic n-p-n bipolar transistor. FIG. 6 shows the safe operating area (SOA) 620 limitation, corresponding to the maximum rated current 650 for the specified design margin between the maximum rated voltage 630 and the physical breakdown voltage 640. It is well known in the art that the on-state resistance of this structure is proportional to the breakdown voltage. Thus it is clear that this excess design margin dramatically increases the device on-state resistance and the die size.

Figure 7A:
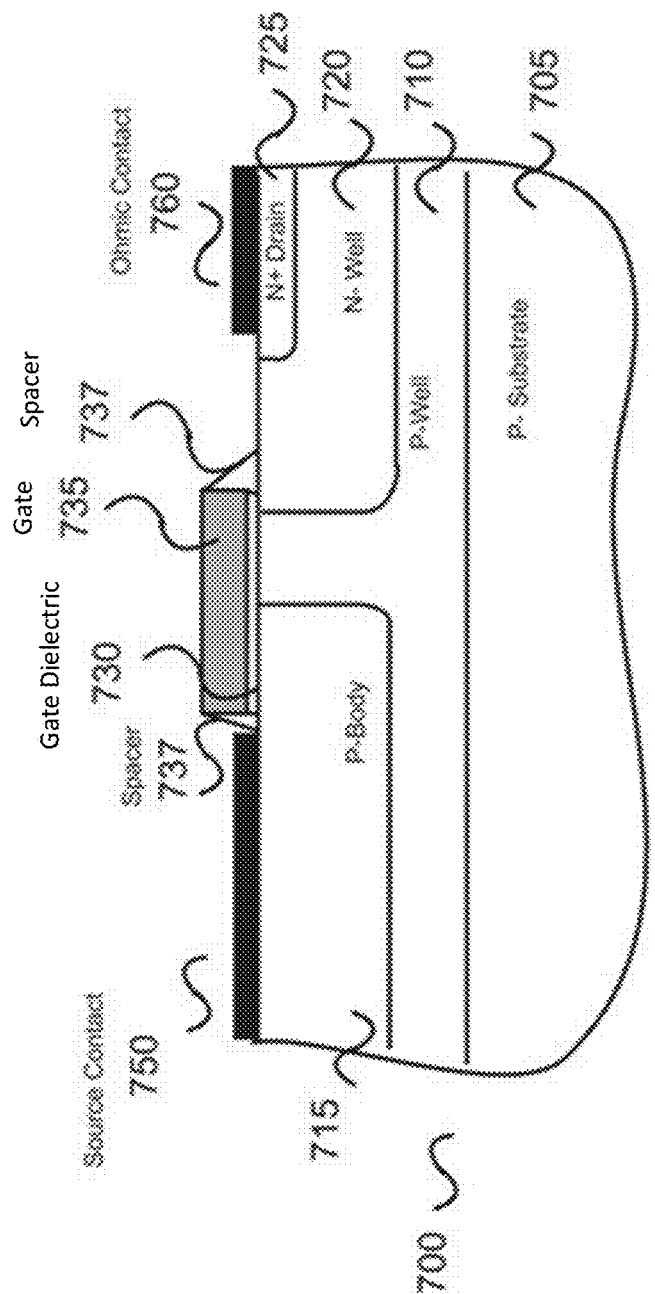
FIG. 7A illustrates a first cross-section of a Schottky Barrier LDMOS (SBLDMOS) structure with shallow trench isolation in accordance with a first embodiment of the present invention.

FIG. 7A illustrates a cross-section of a Schottky Barrier LDMOS (SBLDMOS) structure 700 in accordance with a first embodiment of the present invention. The structure 700 contains a p-substrate wafer 705. A p-well region 710 is in the substrate region 705. The n-well region 720 is formed in the p-well 710. A p-body 715 is contained within the p-well 710. The p-well can have a greater depth than the p-body, or equivalent depth. A p-body is an additional implant to customize for the power transistor for optimization of the device characteristics. An n+ drain region 725 is fabricated in an n-well 720 that serves as a n− drift region. A thin gate oxide 730 is formed on top of the n− drift region 720 and is partially covered by a gate structure 735 typically formed from n+ polysilicon. The gate structure 735 has a spacer structure 737 on the sidewall.

A Schottky or Schottky-like source contact 750 is formed on a p-body region 715. The p-type body region can have the same depth and profile as a p-well. The Schottky or Schottky-like source contact and the p-body region are self-aligned (or non-self-aligned) to a common photolithographic feature or is defined by separate photolithographic features. The n+ drain region 725 is placed in the n-well region 720. An ohmic contact 760 is formed on the n+ drain region 725. Metallization layers and interlevel dielectric (ILD) are placed on the transistor structure. The spacer structure 737 is symmetric or asymmetric on the two sides of the gate structure 735. Preferably, an asymmetrical spacer structure provides the flexibility to independently establish the appropriate electrical coupling on the source side independent of the drain side. A disposable spacer technique can be utilized to create a thin spacer on the source side to allow improved electrical coupling between the Schottky or Schottky-like source contact and the channel region defined by the gate. A spacer is formed at the source side of the gate to properly control the distance between the edge of the gate and the edge of the Schottky or Schottky-like contact.

A Schottky or Schottky-like contact is outside the gate at some critical distance, as opposed to under the gate, as the doped source/drain (S/D) region or Lightly Doped Drain (LDD) is in a conventional MOSFET. The critical distance between the gate and the Schottky or Schottky-like contact is between about 1 nm and about 100 nm. Preferably, the distance between the gate and the Schottky or Schottky-like contact is between about 10 nm and about 50 nm. The source region and/or the drain region can be underlapped with the gate structure, and the distance between the gate and the Schottky contact or Schottky-like contact can be less than 10 nm. The spacer is made from $SiO_2$, SiN, or any other insulating material. After the spacer formation, standard photolithography techniques are used to define regions where the p+ body contact is implanted. After the p+ body contact implant and anneal, the Schottky or Schottky-like contact is formed. By way of example and not limitation, the Schottky or Schottky-like contact is formed, using the so-called Silicidation-Induced Dopant Segregation (SIDS) technique. For an n-type device, before a source side silicide is formed, the silicon surface is arsenic implanted (dopant segregation implant), at a dose, for example, of $10^{15}$ $cm^{-3}$. Immediately following the implant, without annealing, the source metal is deposited using refractory metals such as Co, Ni, Pt, Ta, Ti, TiN, Pd, Ni/Pt, or W.

The anneal has the dual effect of generating the desired silicide stoichiometry as well as pushing the dopant distribution ahead of the silicide/silicon interface to form a region ranging from about 1 nm to about 100 nm between the source silicide and the channel of the transistor. In another embodiment, the region ranges from about 5 nm to about 30 nm.

Another technique for forming the Schottky or Schottky-like contact is by using an appropriately valued work function material selected from the group of transition elements from the d-block or the f-block lanthanide series of the periodic table, and their respective silicides, without requiring the use of a SIDS technique. In either case, the most important attribute of the structure is a Schottky or Schottky-like source contact is formed at the source and/or drain to channel junction, at what is normally a pn junction interface. In the case of SIDS formation, the barrier height can be adjusted via anneal parameters (e.g., anneal temperature and anneal time) or dopant segregation implant parameters (e.g., dopant segregation implantation dose and dopant segregation implantation energy). With or without using the SIDS technique, it is desirable for the barrier height to be minimized for high-performance devices.

Structurally, the Schottky or Schottky-like contact comprises a first film and a second film, where the first film is a silicide film, and a second film is an interfacial dopant layer. Note that at least one Schottky or Schottky-like contact is provided on the source region, or the drain region, or both, wherein the at least one Schottky or Schottky-like contact is formed substantially near the surface of the substrate. The Schottky or Schottky-like contact includes a silicide layer and an interfacial dopant segregation layer, wherein the interfacial dopant segregation layer is substantially near the gate structure to provide electrical coupling to the gate and channel region. With the formation of the silicide, a "snowplow" effect occurs that pushes the implant dopants into the substrate as the silicide layer forms. The snowplowing of the implant occurs as the refractory metal consumes the silicon atoms to form the silicide. The experimental results demonstrate that the snowplowing effect causes the tail of the implant to be pushed into the silicon substrate, with the peak concentration at the silicide-silicon interface. With the formation of the silicide, the physical push of impurities during silicidation, results in a steeper, modified impurity profile than that seen in conventional diffused profiles. A highly-doped region of impurities is used to control the electrical barrier between the amorphous silicide (metal) and the single-crystal silicon.

Figure 16:
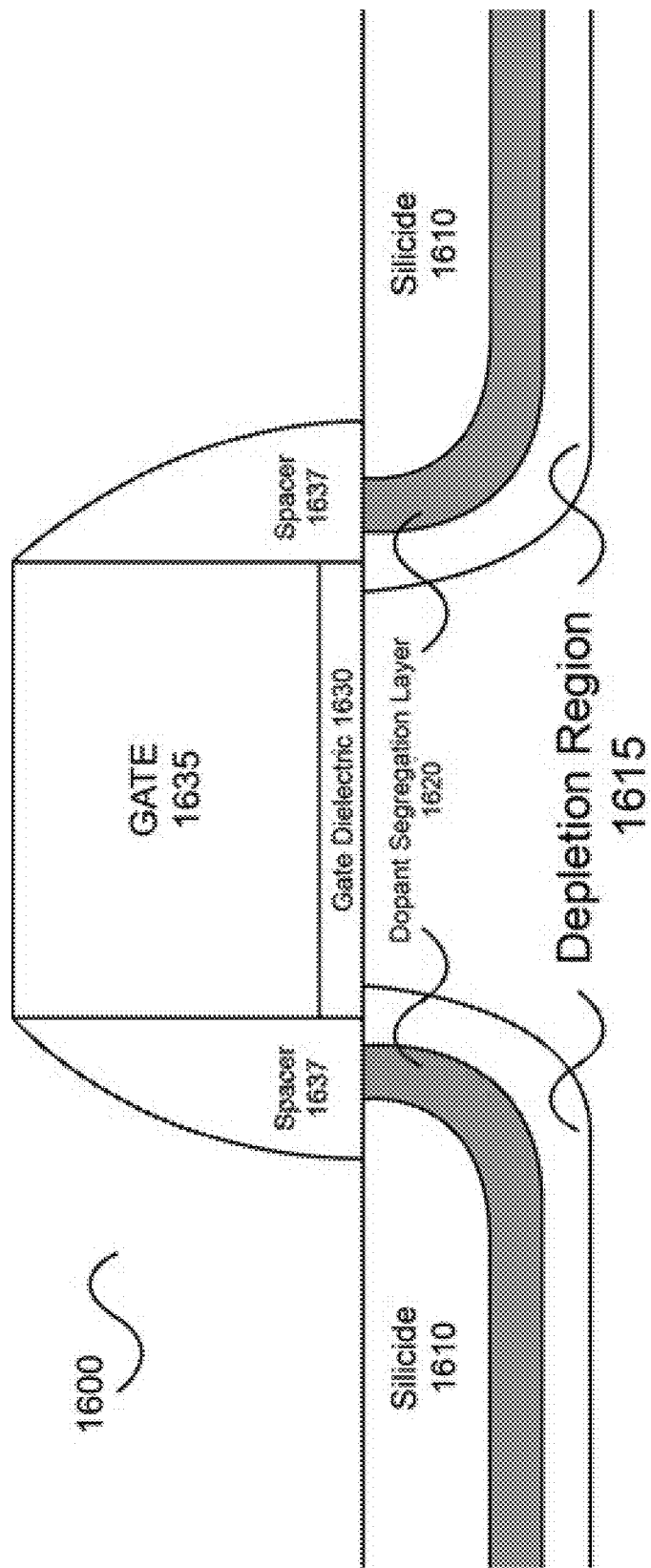
FIG. 16 illustrates a cross-section of a field effect transistor with a Schottky or Schottky-like contact as the source and drain regions.

FIG. 16 illustrates a cross-section of a field effect transistor with a Schottky or Schottky-like contact as the source and drain regions. The Schottky barrier height of the Schottky or Schottky-like contact can be adjusted with common anneal techniques. Silicide formation utilizes, for example, a single-stage anneal or a multi-stage anneal involving both formation and conversion steps. Depending on the technique and the silicide material being utilized, the anneal temperatures can be in the temperature range of about 260° C. to about 850° C. The Schottky barrier height can also be adjusted by the implantation dose and/or the implantation energy. The depletion region 1615 of the Schottky or Schottky-like contact must extend past the dopant segregation layer 1620 to under the gate region 1635 to allow for electrical coupling between the source and the channel defined by the gate region of the power transistor. This coupling can be adjusted by the spacer thickness, implantation dose, implantation energy and thermal anneals.

Figure 7B:
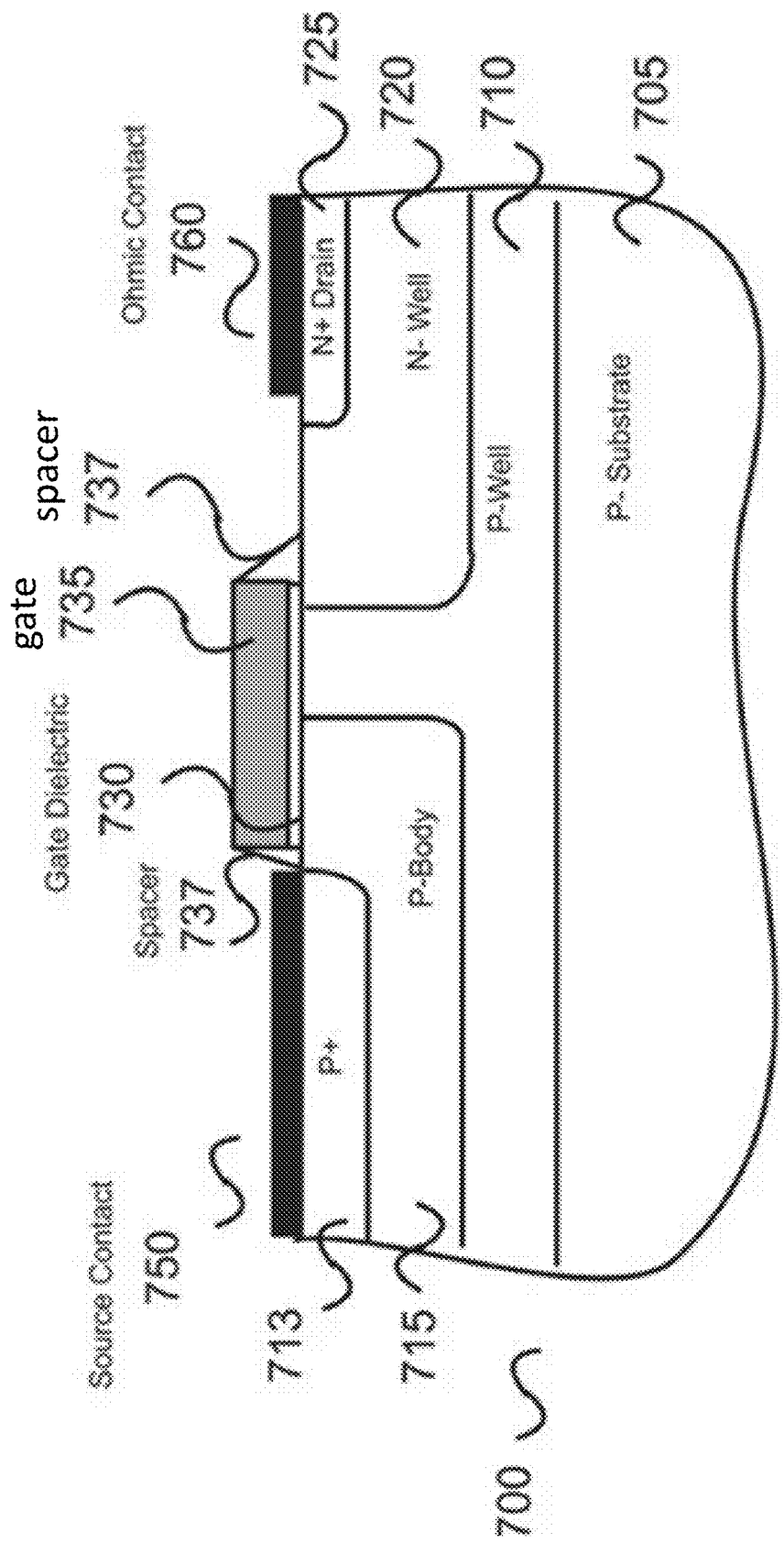
FIG. 7B illustrates a second cross-section of a Schottky Barrier LDMOS (SBLDMOS) structure with shallow trench isolation in accordance with the first embodiment of the present invention.

FIG. 7B illustrates another cross-section through the intermittent p+ body contact region of a Schottky Barrier LDMOS (SBLDMOS) structure 700 in accordance with the first embodiment of the present invention. The structure 700 contains a p-substrate wafer 705. A p-well region 710 is in the substrate region 705. The n-well region 720 is formed in the p-well 710. A p-body 715 is contained within the p-well 710. A p+ body contact region 713 is placed under the Schottky or Schottky-like contact 750 in the source region, and within the p-body region 715. An n+ drain region 725 is fabricated in an n-well 720 that serves as a n− drift region.

A thin gate oxide 730 is formed on top of the n− drift region 710 and is partially covered by a gate structure 735 typically formed from n+ polysilicon. The gate structure 735 has a spacer structure 737 on the sidewall. The spacer structure 737 is asymmetric on the two sides of the gate structure 735.

Note that the spacer can be optimized to provide electrical coupling to the interfacial dopant segregation layer of the Schottky or Schottky-like contact. A disposable spacer technique can be utilized wherein the spacer can be removed for electrical coupling optimization. A Schottky or Schottky-like contact 750 can form a Schottky barrier junction on a p-body 715. A channel region is formed by the difference in lateral diffusion between a p-type body region 715 (also known as a p-well) and a Schottky or Schottky-like contact 750. The Schottky or Schottky-like contact (e.g. source) and body regions are self-aligned (or non-self-aligned) to a common photolithographic feature or is defined by separate photolithographic features. The n+ drain region 725 is placed in the n-well region 720. An ohmic contact 760 is formed on the n+ drain region 725. Metallization layers and interlevel dielectric (ILD) are placed on the transistor structure. The p-body contact 713 is placed in the p-body 715.

Continuous p+ body contacts are utilized in the prior art to provide an exit path for impact ionized holes and minimize the bipolar current gain of the parasitic bipolar n-p-n transistor. The continuous p+ body contacts also eliminate undesirable variation in the device threshold voltage due to the floating body (well) effect. Advantageously, the Schottky or Schottky contact in the source and/or the drain region eliminates the parasitic bipolar n-p-n transistor in many power transistor devices. Meanwhile, preventing the p-body (p-well) region from floating requires substantially smaller contact area than is need to prevent the parasitic bipolar n-p-n transistor from turning on. Thus, periodic and non-continuous p+ body contacts are utilized in the present invention to eliminate the floating body (well) effect with reduced device size.

Figure 8:
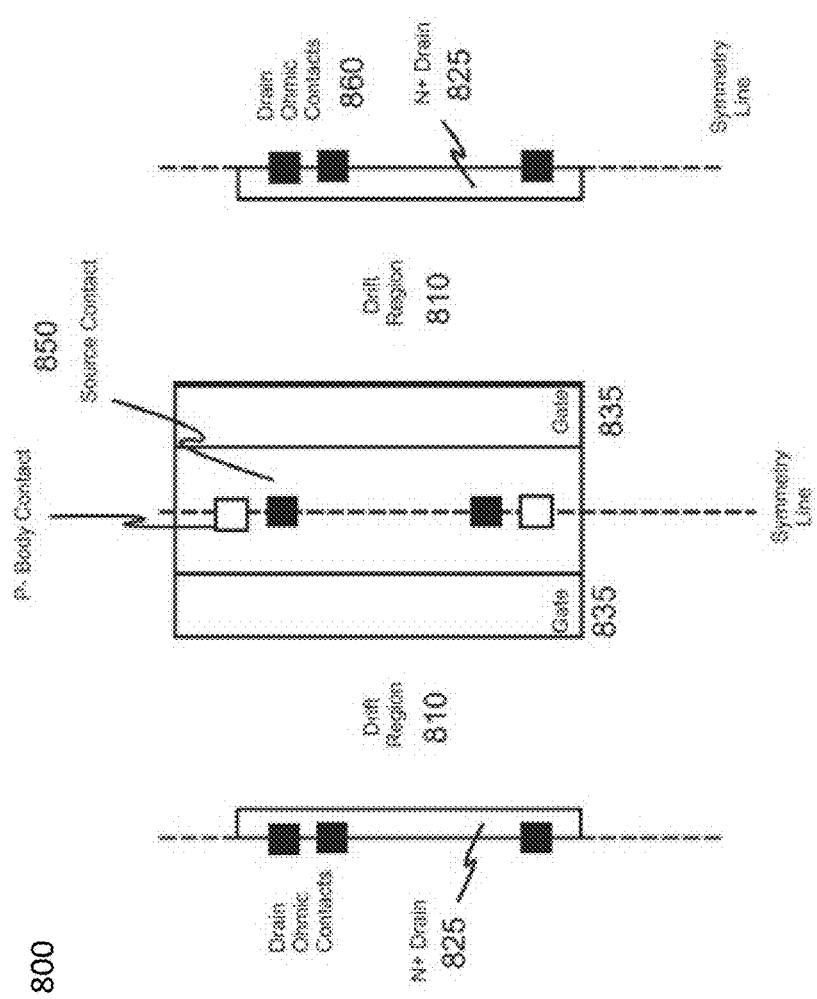
FIG. 8 illustrates a top view of the SBLDMOS structure in accordance with the first embodiment of the present invention.

FIG. 8 illustrates a top view of the SBLDMOS structure in accordance with the first embodiment of the present invention. FIG. 8 shows a SBLDMOS structure 800 from the source to drain region. The SBLDMOS structure 800 exists on the surface of p-substrate. An n− drift region 810 is placed in the p-substrate wafer (not shown). A p− body contact 815 is placed on a p-body region. A n-type drain 825 is separated from the gate 835 by the n− drift region 810. Note that the continuous p+ body contact structure is eliminated, reducing the device area. The present embodiment can utilize a non-continuous body contact. The source contact 850 is a Schottky or Schottky-like contact. In FIG. 8, the source region 850 is periodically interrupted by p+ body contacts, which allow ohmic contact to the underlying p-well (or p-body) region. These periodic p+ body contacts eliminate undesirable floating well effects without significant negative side effects in device area or performance.

A Schottky or Schottky-like contact can be formed by a variety of techniques, including pure metal deposition, silicide deposition, dopant segregation or novel contact techniques. The spacer width is optimized to provide optimum electrical coupling to the dopant segregation implant layer of the Schottky or Schottky-like contact. The spacer width is between about 1 nm and about 100 nm. Preferably, the spacer width is between about 10 nm and about 50 nm. If the power transistor has an ohmic contact on the drain, the spacer structure width is the same as utilized by other transistors on the semiconductor chip (e.g. the standard MOSFET spacer width), which provides an asymmetric spacer deposition between the source and drain regions.

Since embodiments of the invention do not include a n+ source region, the parasitic n-p-n transistor and its associated undesirable effects are eliminated.

Figure 9:
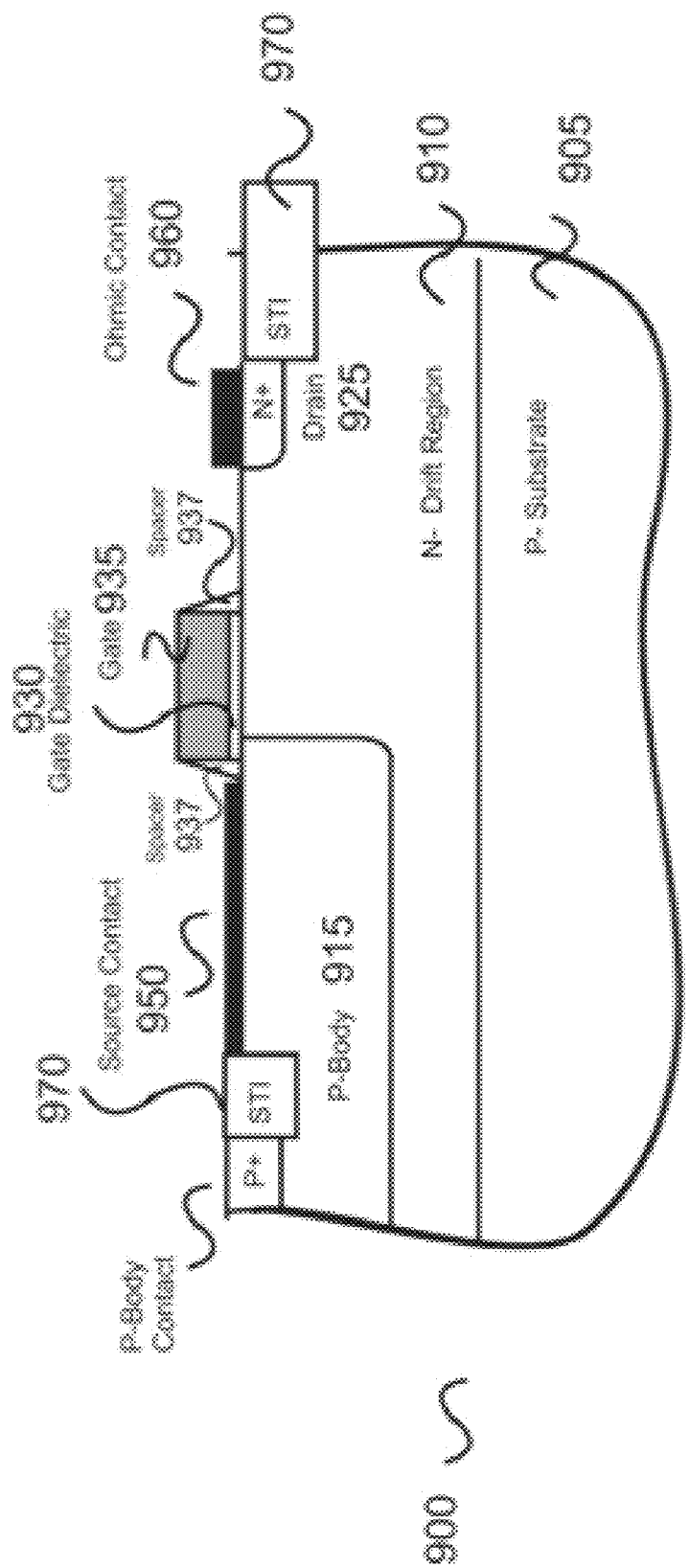
FIG. 9 illustrates a cross-section of a Schottky Barrier LDMOS (SBLDMOS) structure with shallow trench isolation (STI) in accordance with a second embodiment of the present invention.

FIG. 9 illustrates a cross-section of a Schottky Barrier LDMOS (SBLDMOS) structure with shallow trench isolation (STI) in accordance with a second embodiment of the present invention. The structure 900 contains a p-substrate wafer 905 with shallow trench isolation (STI) 970. An n− region 910 forms a drift region, n− drift, for the power MOSFET 900. The n-drift region 910 is formed in bulk silicon as an n-type epitaxial layer, or a silicon-on-insulator (SOI) wafer, or as an implanted and diffused region into either a bulk or epitaxial silicon layer. A p-body region 915 is contained within the n− drift region 910. An n+ drain region 925 is fabricated in an n− drift region 910. A thin gate oxide 930 is formed on top of the n− drift region 910 and is partially covered by a gate structure 935 typically formed from n+ polysilicon. The gate structure can have a spacer or a disposable spacer structure. The spacer can also be symmetric or asymmetric to allow coupling between the Schottky or Schottky-like source and the channel region. Shallow trench isolation 970 separates the p-body contact from the source Schottky or Schottky-like contact structure 950.

Figure 10:
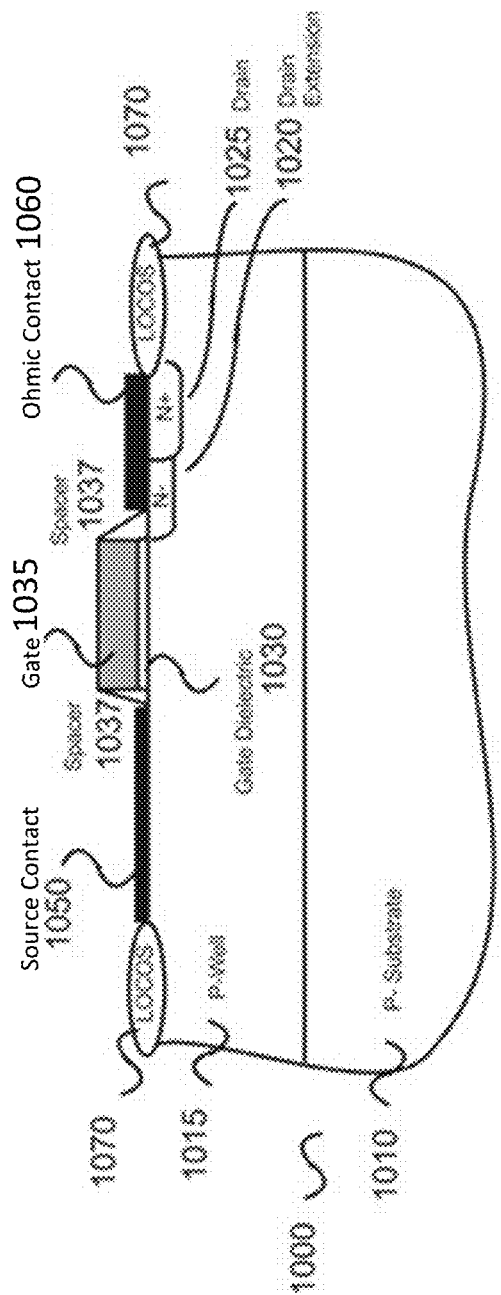
FIG. 10 illustrates a cross-section of a Schottky Barrier Drain Extended MOS (SBDeMOS) structure in accordance with a third embodiment of the present invention.

FIG. 10 illustrates a cross-section of a Schottky Barrier Drain Extended MOS (SBDeMOS) structure in accordance with a third embodiment of the present invention. FIG. 10 illustrates a cross-section of a Schottky Barrier Drain Extended (SBDeMOS) structure 1000 with Local Oxidation of Silicon (LOCOS) isolation 1070 in accordance with the third embodiment of the present invention. The structure 1000 contains a p-substrate wafer 1010. A p-well 1015 is formed on the substrate 1010 for the power MOSFET 1000. An n+ drain region is a n+ drain 1025 and n+ drain extension 1020 implant placed in the p-well 1015. An ohmic contact 1060 is formed on the n+ drain region 1025. A thin gate oxide 1030 is formed on the p-well 1015, followed by a gate structure 1035 typically formed from n+ polysilicon. The gate structure 1035 comprises a plurality of films, bordered by a sidewall spacer 1037. A Schottky or Schottky-like contact 1050 is formed on the source region 1015. The gate structure can have a spacer or a disposable spacer structure. The spacer can also be symmetric or asymmetric to allow coupling between the Schottky or Schottky-like source and the channel region. To establish coupling between the Schottky barrier and the gate structure, the spacer can be reduced in dimension, or removed.

Figure 11:
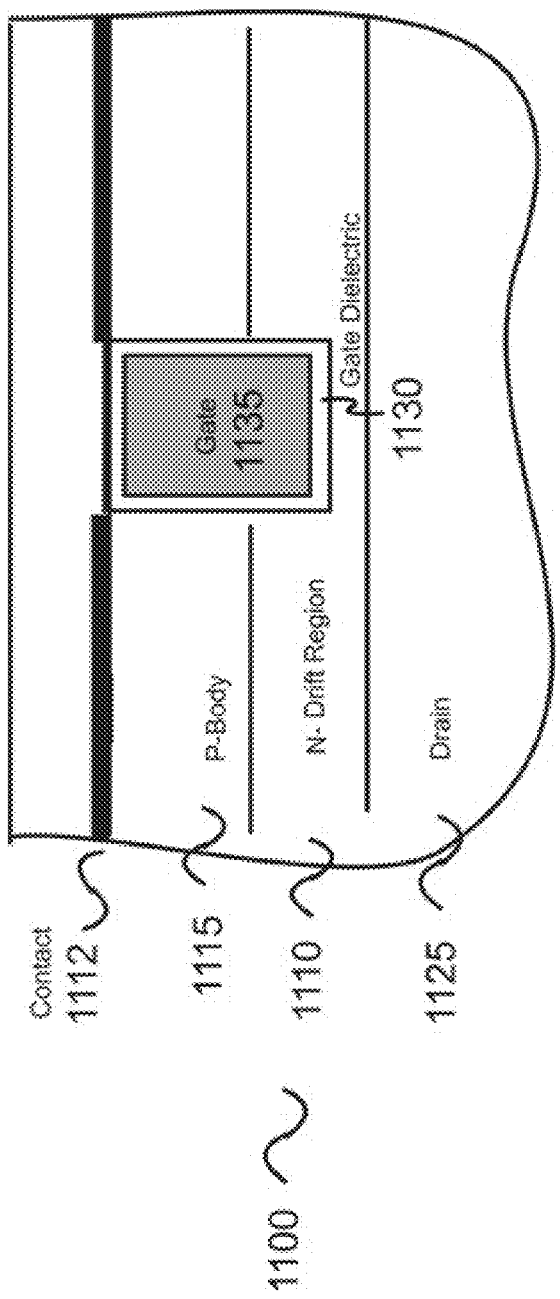
FIG. 11 illustrates a cross-section of a Schottky Barrier Trench MOS (SBTMOS) structure in accordance with a fourth embodiment of the present invention.

FIG. 11 illustrates a cross-section of a Schottky Barrier Trench MOS (SBTMOS) structure 1100 in accordance with a fourth embodiment of the present invention. FIG. 11 illustrates a cross-section through a source region of a vertical trench MOSFET 1100. The structure is placed on a n+ drain 1125 and a n− epitaxial region 1110. A p-body 1115 is formed on a n− epitaxial region 1110. The intermittent p-body contact to p-body 1115 is not shown in this cross-section. The source region utilizes a Schottky or Schottky-like source contact 1112. The trench gate dielectric 1130 is located around the trench gate structure 1135. The trench power MOSFET 1100 extends from the drain 1125, n− drift region 1110, and p-body 1115 to the Schottky or Schottky-like source contact 1112. The parasitic n-p-n bipolar junction transistor can lead to latchup, single event latchup (SEL), soft error rate failures and failures due to unclamped inductive switching. In this embodiment of the present invention, the parasitic n-p-n transistor and its associated undesirable effects are similarly eliminated.

Figure 12:
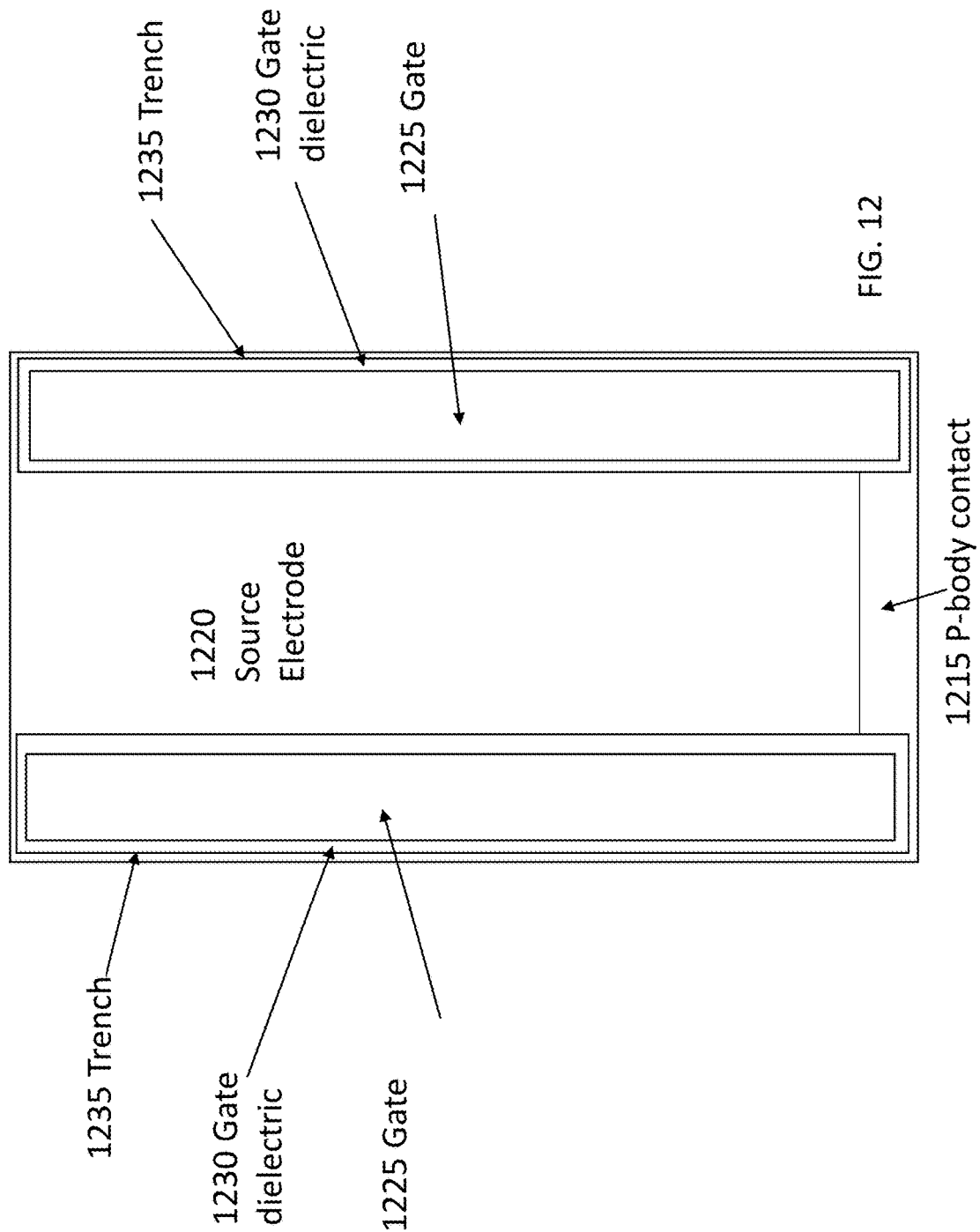
FIG. 12 illustrates a top surface view of the Schottky Barrier Trench MOS (SBTMOS) in accordance with a fourth embodiment of the present invention.

FIG. 12 illustrates the top surface of a vertical trench MOSFET 1200 according to the fourth embodiment of the present invention. FIG. 12 shows the structure 1200 with p+ body contact 1215, n+ source 1220 and underlying Schottky or Schottky-like source contact integrated on the top surface (not shown in the figure). The gate 1225, trench gate dielectric 1230 and trench structure 1235 are on both sides of the n+ source electrode 1220. FIG. 12 also shows periodic p+ body contacts 1215 integrated into the device source region. In this vertical trench structure 1200, there is no continuous p+ body contact. These periodic p+ contacts 1215 eliminate undesirable floating well effects without significant negative side effect in device area or performance.

Figure 13:
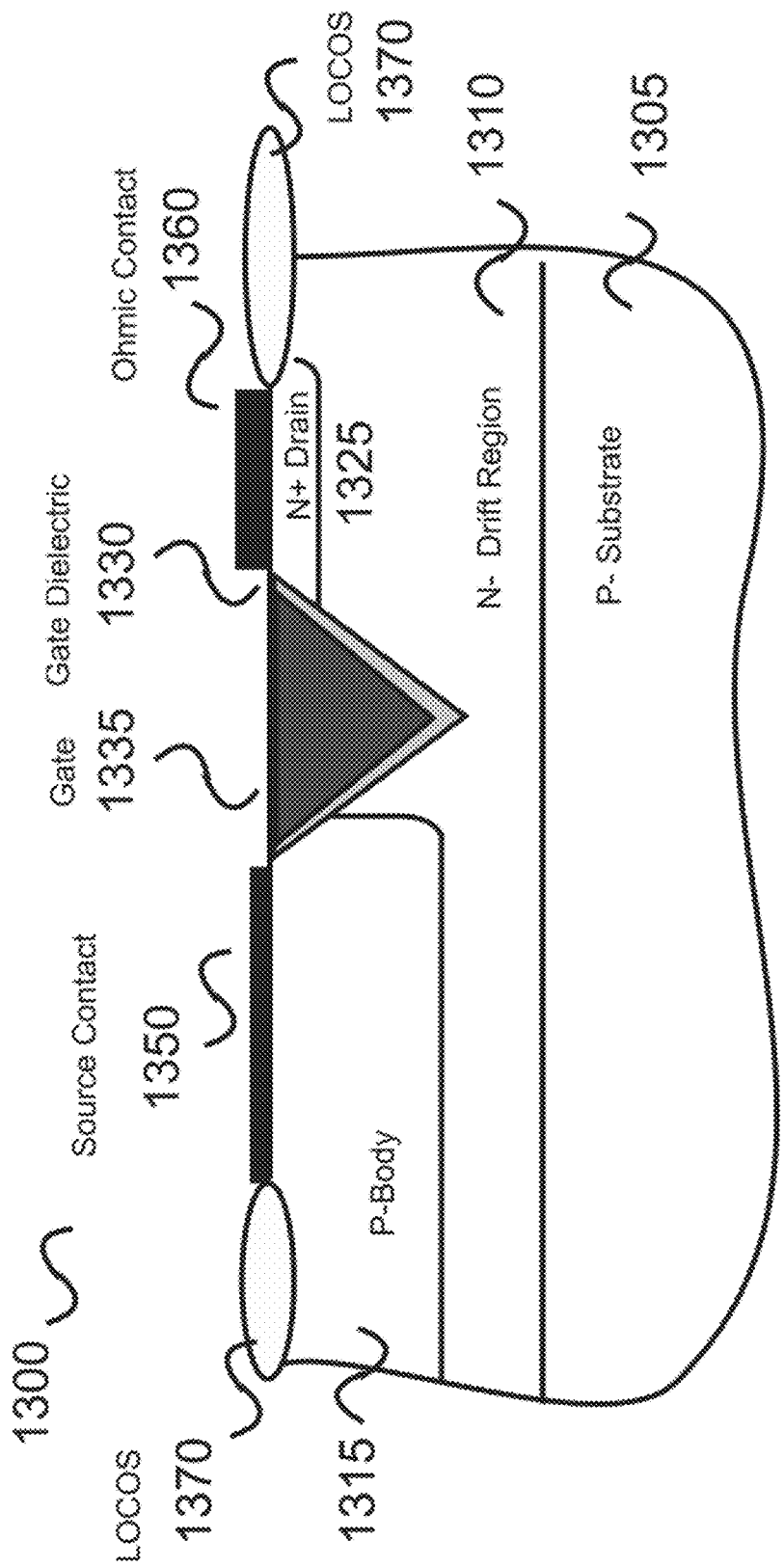
FIG. 13 illustrates a cross-section of a Schottky Barrier VMOS (SBVMOS) structure in accordance with a fifth embodiment of the present invention.

FIG. 13 illustrates a cross-section of a Schottky Barrier VMOS (SBVMOS) structure in accordance with a fifth embodiment of the present invention. FIG. 13 illustrates a cross-section of a Schottky Barrier VMOS (SBVMOS) structure 1300 in accordance with the fifth embodiment of the present invention. The structure 1300 contains a p-substrate wafer 1305. An n− region 1310 forms a drift region, n− drift, for the power MOSFET 1300. The n− drift region 1310 is formed in bulk silicon, as an n-type epitaxial layer on a p-type or n-type substrate, or a silicon-on-insulator (SOI) wafer, or as an implanted and diffused region into either a bulk or epitaxial silicon layer. A p-body 1315 is contained within the n− drift region 1310. An n+ drain region 1325 is fabricated in an n− drift region 1310. A V-shaped, thin gate oxide 1330 is formed on top of the n− drift region 1310 and is partially covered by a gate structure 1335 typically formed from n+ polysilicon. A Schottky or Schottky-like contact 1350 can form a Schottky barrier junction on a p-body 1315. A channel region is formed by the difference in lateral diffusion between a p-type body region 1315 (also known as a p-well) and a Schottky or Schottky-like contact 1350. The Schottky or Schottky-like contact (e.g. source) and the body region are self-aligned (or non-self-aligned) to a common photolithographic feature or is defined by separate photolithographic features. The n+ drain region 1325 is placed in the n− drift region 1310. An ohmic contact 1360 is formed on the n+ drain region 1325. The drain structure is defined by LOCOS isolation, shallow trench isolation (STI), or VMOS gate structure 1335. The drain structure is defined by the isolation on at least one side. Metallization layers and interlevel dielectric (ILD) are placed on the transistor structure.

Figure 14:
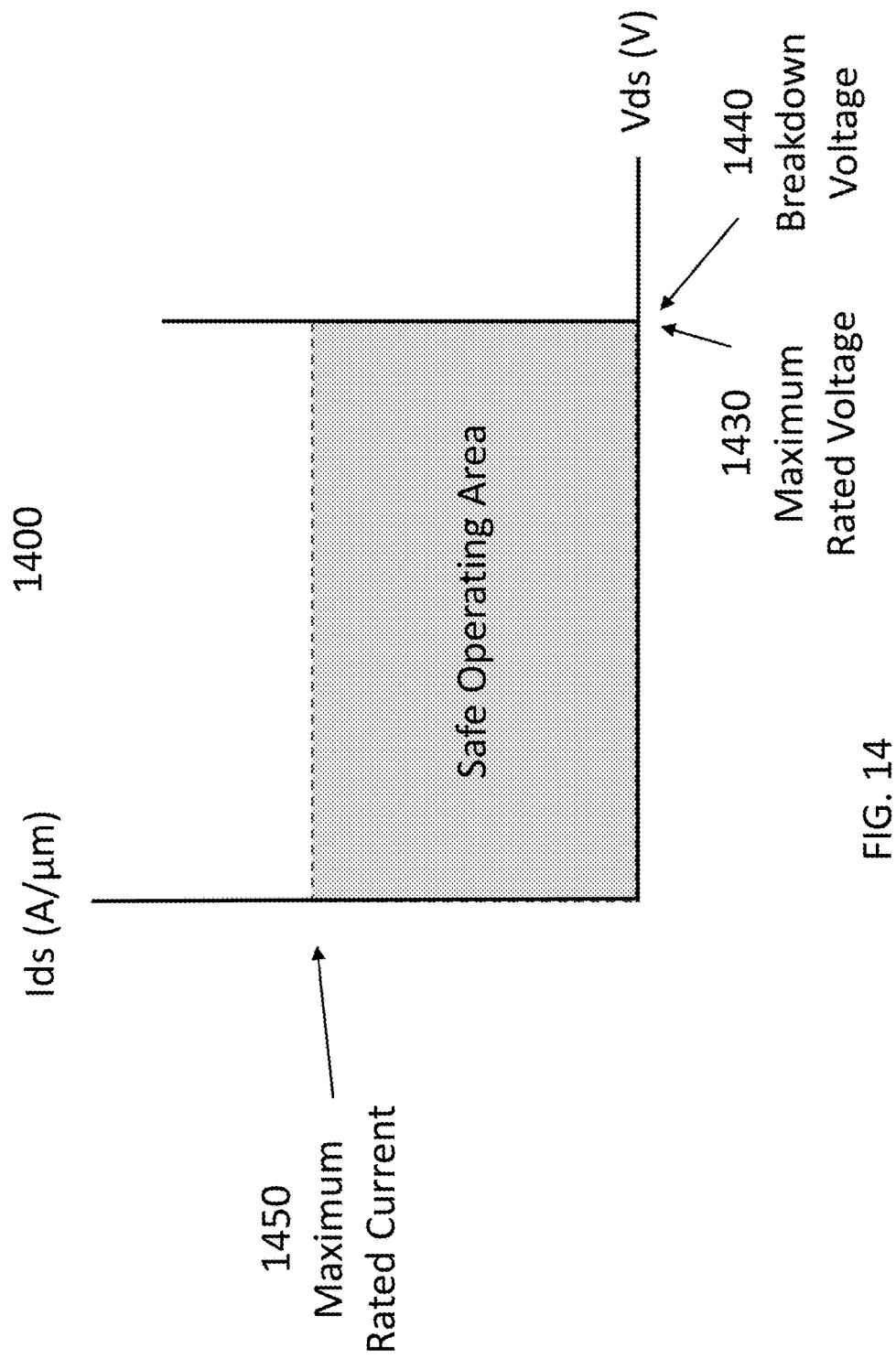
FIG. 14 is a plot of the current-voltage (I-V) characteristic of the Schottky Barrier LDMOS (SBLDMOS) device.

FIG. 14 is a plot of the current-voltage (I-V) characteristic 1400 of the Schottky Barrier LDMOS (SBLDMOS) device. FIG. 14 is a current-voltage (I-V) characteristic of a power MOSFET highlighting the safe operating area (SOA). FIG. 14 shows a plot 1400 of the drain-to-source current (Ids) versus drain-to-voltage (Vds). In the plot 1400, there is no snapback characteristic observed due to elimination of the parasitic n-p-n bipolar junction transistor, enabling a higher maximum rated current 1450 for a specified maximum rated voltage 1430. FIG. 14 shows the square safe operating area (SOA) 1420 eliminates the design margin between the maximum rated voltage 1430 and the physical breakdown voltage 1440.

The power transistors in the present invention have an improved SOA and device reliability with a lower specific on-state resistance and a reduced device size. As an example, but not for limitation, for an SBLDMOS, with 20% improvement in the SOA, the specific on-state resistance is reduced by 40%, and the die area of the SBLDMOS is shrunk by 20%. Also as an example but not for limitation, for a vertical trench MOSFET with a Schottky or Schottky-like contact in the source region and/or the drain region, with 20% improvement in the SOA, the specific on-state resistance is reduced by 20%, and the die area of the vertical transistor is shrunk by 20%.

Figure 15:
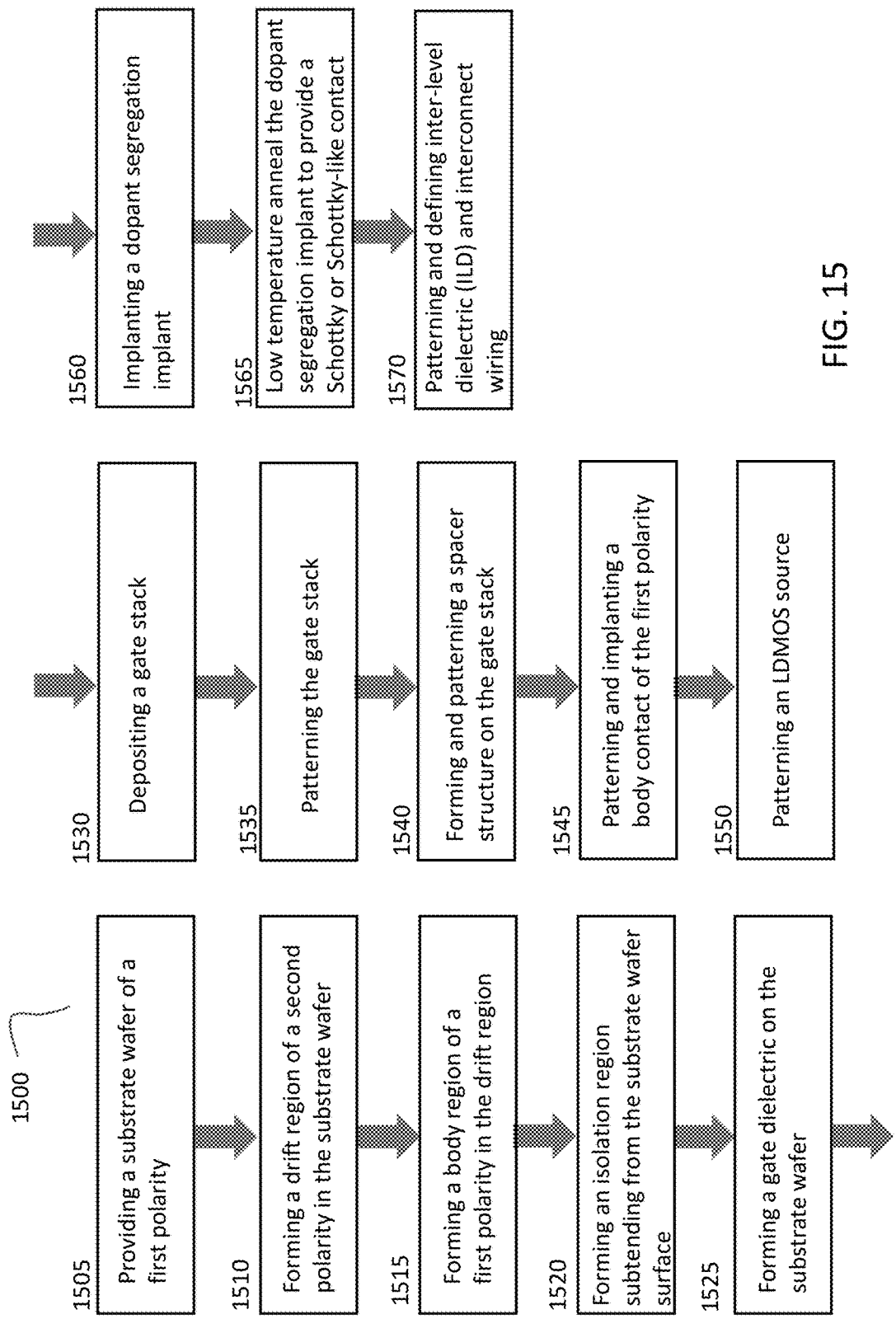
FIG. 15 is a flow diagram for a method of forming a Schottky Barrier LDMOS (SBLDMOS) structure in accordance with the first embodiment of the present invention.

FIG. 15 is a flow diagram for a first method of forming a Schottky Barrier LDMOS (SBLDMOS) structure in accordance with the first embodiment of the present invention. A method 1500 of forming a Schottky Barrier LDMOS includes the steps of:

1) 1505 providing a substrate wafer of a first polarity;
2) 1510 forming a drift region of a second polarity in the substrate wafer;
3) 1515 forming a body region of a first polarity in the drift region;
4) 1520 forming an isolation region on subtending from the substrate wafer surface;
5) 1525 forming a gate dielectric on the substrate wafer;
6) 1530 depositing a gate stack;
7) 1535 patterning the gate stack;
8) 1540 forming and patterning a spacer structure on the gate stack;
9) 1545 patterning and implanting a body contact of a first polarity;
10) 1550 patterning a LDMOS source;
11) 1560 implanting a dopant segregation implant;
12) 1565 low temperature annealing the dopant segregation implant to provide a Schottky or Schottky-like contact; and
13) 1570 patterning and defining inter-level dielectric (ILD) and interconnect wiring.

A second method of forming a Schottky Barrier LDMOS (SBLDMOS) structure in accordance with the first embodiment of the present invention includes the steps of:

1) providing a substrate wafer of a first polarity;
2) forming a drift region of a second polarity in the substrate wafer;
3) forming a body region of a first polarity in the drift region of a first polarity;
4) forming an isolation region on subtending from a surface of the substrate wafer;
5) forming a gate dielectric on the substrate wafer;
6) depositing a gate stack;
7) patterning the gate stack;
8) forming and patterning a spacer structure on the gate stack;
9) patterning and implanting a dopant implant of a second polarity;
10) patterning and implanting a body contact of a first polarity;
11) patterning an LDMOS source and strip;
12) forming a CMOS silicide;
13) implanting a dopant segregation implant;
14) low temperature annealing the dopant segregation implant to provide a Schottky or Schottky-like contact; and
15) patterning and defining inter-level dielectric (ILD) and interconnect wiring.

A third method of forming a Schottky Barrier LDMOS (SBLDMOS) structure in accordance with the first embodiment of the present invention includes the steps of:

1) providing a substrate wafer of a first polarity;
2) forming a drift region of a second polarity in the substrate wafer;
3) forming a body region of a first polarity in the drift region of a first polarity;
4) forming an isolation region on subtending from the substrate wafer surface;
5) forming a gate dielectric on the substrate wafer;
6) depositing a gate stack;
7) patterning the gate stack;
8) forming and patterning a spacer structure on the gate stack;
9) patterning and implanting a dopant implant of a second polarity;
10) patterning and implanting a body contact of a first polarity;
11) patterning an LDMOS source;
12) striping a LDMOS spacer;
13) implanting a dopant segregation implant;
14) forming a CMOS silicide;
15) low temperature annealing the dopant segregation implant to provide a Schottky or Schottky-like contact; and
16) patterning and defining inter-level dielectric (ILD) and interconnect wiring.

A fourth method of forming a Schottky Barrier LDMOS (SBLDMOS) structure in accordance with the first embodiment of the present invention includes the steps of:

1) providing a substrate wafer of a first polarity;
2) forming a drift region of a second polarity in the substrate wafer;
3) forming a body region of a first polarity in the drift region of a first polarity;
4) forming an isolation region on subtending from a surface of the substrate wafer;
5) forming a gate dielectric on the substrate wafer;
6) depositing a gate stack;
7) patterning the gate stack;
8) forming and patterning a spacer structure on the gate stack;
9) patterning and implanting a dopant implant of a second polarity;
10) patterning and implanting a body contact of a first polarity;
11) patterning an LDMOS source;
12) striping a LDMOS spacer;
13) forming a CMOS silicide;
14) implanting a dopant segregation implant;
15) low temperature annealing the dopant segregation implant to provide a Schottky or Schottky-like contact; and
16) patterning and defining inter-level dielectric (ILD) and interconnect wiring.

Additionally, a method of forming a Schottky Barrier LDMOS (SBLDMOS) structure in a CMOS or BiCMOS technology in accordance with the first embodiment of the present invention includes the steps of:

1) providing a substrate wafer of a first polarity;
2) forming a drift region of a second polarity in the substrate wafer;
3) forming a body region of a first polarity in the drift region of a first polarity;
4) forming an isolation region on subtending from a surface of the substrate wafer;
5) forming a gate dielectric on the substrate wafer;
6) depositing a gate stack;
7) patterning the gate stack;
8) forming and patterning a spacer structure on the gate stack;
9) patterning and implanting a dopant implant of a second polarity;
10) patterning and implanting a body contact of a first polarity;
11) patterning an LDMOS source;

12) striping a LDMOS spacer;
13) implanting a dopant segregation implant;
14) forming a CMOS silicide; and
15) low temperature annealing the dopant segregation implant to provide a Schottky or Schottky-like contact; and
16) patterning and defining inter-level dielectric (ILD) and interconnect wiring.

In addition, another method of forming a Schottky Barrier LDMOS (SBLDMOS) structure in a CMOS or BiCMOS technology in accordance with the first embodiment of the present invention uses a pure metal source, without a dopant segregation implant. For the Schottky metallization, transition elements from the d-block or the f-block lanthanide series of the periodic table, and their respective silicides, can be deposited.

It is understood by those skilled in the art that an appropriate isolation scheme should be used. The appropriate isolation scheme can be an STI process, LOCOS process or other technique suitable for these types of devices. Similarly, it is understood that the gate material and the corresponding gate work function could be modified or set to a suitable value based upon an intended application of the device.

In the above methods, after the gate material is deposited and patterned, a spacer layer is formed to properly control the distance between the edge of the gate and the edge of the Schottky silicide. The metal or silicide S/D region is outside the gate at some critical dimension, as opposed to under the gate, as the doped S/D region or LDD is in a conventional MOSFET.

In one embodiment, the distance between the gate and the Schottky or Schottky-like contact is between about 1 nm and about 100 nm. In another embodiment, the distance between the gate and the Schottky or Schottky-like contact is between about 10 nm and about 50 nm. In yet another embodiment, the source region and/or the drain region is underlapped with the gate structure, and the distance between the gate and the Schottky or Schottky-like contact is less than 10 nm. The spacer is made from $SiO_2$, SiN or any other convenient insulating material. After the spacer formation, standard photolithography techniques are used to define regions where the p+ body contact is implanted. After the p+ body contact implant and anneal, the Schottky or Schottky-like contact is formed. This could be done, for example, by using the Silicidation-Induced Dopant Segregation (SIDS) technique. For an n-type device, before a source/drain silicide is formed, the silicon surface is arsenic implanted (dopant segregation implant), at a dose, for example, of $10^{15}$ $cm^{-3}$. Immediately following the implant, without annealing, the source/drain metal is deposited using, for example Co, Ni or Pt. Silicide formation takes place via a subsequent anneal, for example, a single-stage anneal, or a multi-stage anneal involving both formation and conversion steps. Depending on the technique and the silicide material being utilized, the anneal temperatures can be in the temperature range of about 260° C. to about 850° C.

It is understood that alternate structures and methods exist for establishing equivalent power transistors. Alternate Schottky-like contacts include pure metal, metal source and/or metal drain, without the dopant segregation interfacial layer. Alternate silicides can be formed with transition metals such as Co, Ti, Ta, TiN, Ni, Pd, Pt, Ni/Pt, and W. The power transistor device can utilize pure metal or silicide to semiconductor as the source/drain with an interfacial layer.

In commercial practice, it is desirable to integrate the Schottky LDMOS power transistor with various logic and control devices formed from bipolar, CMOS or BiCMOS elements. With the integration of LDMOS elements with BiCMOS elements, the resulting device is sometimes referred to as a BCDMOS device. The references to LDMOS elements or processes integrated with CMOS elements or processes are references to BCDMOS elements, processes or devices as appropriate. It is desirable that the Schottky formation process described above be compatible with the additional bipolar, CMOS or BiCMOS processing. Embodiments for achieving this integration for CMOS or BiCMOS processing are provided. For integration with bipolar processing, the process would be adapted to reflect the differences between bipolar processing and that used for CMOS or BiCMOS devices.

An additional embodiment for processing a Schottky LDMOS power transistor with CMOS and/or BiCMOS elements comprises performing the depositions of the CMOS silicide and the Schottky barrier silicide and performing a single thermal process step for both silicides. For the case where a single thermal processing step is used for the silicides, the additional embodiment further comprises performing the dopant segregation implant before the CMOS silicidation.

It will be understood by those skilled in the art that embodiments of the present invention can be implemented in wafer materials commonly used in the industry such as bulk silicon, SOI, SiC, GaN, GaAs, InP, etc. The use of a particular starting material or material system should not be limited to those explicitly specified. The objective is to be able to build a Schottky or Schottky-like contact within the wafer, thus typical semiconductor-based starting material should be considered. Likewise, the isolation schemes used for isolating active devices or regions within the semiconductor starting material include, but is not limited to, self-isolation, junction isolation, shallow-trench isolation (STI), dielectric isolation, etc.

It should be noted that the description and drawings merely illustrate the principles of the methods and systems provided in the present invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the methods and systems provided in the present invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Other advantages will be recognized by those of ordinary skill in the art. The above detailed description of the present invention, and the examples described therein, has been presented for the purposes of illustration and description. While the principles of the present invention have been described above in connection with a specific device, it is to be clearly understood that this description is made only by way of example and not as a limitation on the scope of the present invention.

Certain modifications and improvements will occur to those skilled in the art upon a reading of the foregoing description. The above-mentioned examples are provided to serve the purpose of clarifying the aspects of the invention and it will be apparent to one skilled in the art that they do not serve to limit the scope of the invention. All modifications and improvements have been deleted herein for the sake of conciseness and readability but are properly within the scope of the present invention.

What is claimed is:

1. A lateral power transistor structure, comprising:
   a substrate of a first dopant polarity;
   a drift region of a second dopant polarity formed on or within the substrate;
   a body region of a first dopant polarity formed on or within the drift region;
   a gate dielectric film in contact with the substrate;
   a gate structure abutting the gate dielectric film;
   a source region outside the gate structure;
   a drain region formed on the substrate;
   wherein periodic and non-continuous body contacts are integrated into the source region; and
   wherein the source region is a Schottky contact formed substantially near a surface of the substrate for eliminating a parasitic bipolar junction transistor for providing an improved safe operating area, reducing a specific on-state resistance of the lateral power transistor structure, and/or reducing a die size of the lateral power transistor structure.

2. The lateral power transistor structure of claim 1, wherein the Schottky or Schottky like contact comprises a silicide layer and an interfacial dopant segregation layer.

3. The lateral power transistor structure of claim 1, further comprising a spacer abutting a sidewall of the gate structure.

4. The lateral power transistor structure of claim 3, wherein the spacer is asymmetric between the source region and the drain region.

5. The lateral power transistor structure of claim 3, wherein a width of the spacer is adjustable for electrical coupling optimization.

* * * * *